(12) United States Patent
Schuster et al.

(10) Patent No.: US 6,806,942 B2
(45) Date of Patent: Oct. 19, 2004

(54) PROJECTION EXPOSURE SYSTEM

(75) Inventors: Karl-Heinz Schuster, Koenigsbronn (DE); Wilhelm Ulrich, Aalen (DE); Toralf Gruner, Koenigsbronn (DE); Daniel Kraehmer, Oberkochen (DE); Wolfgang Singer, Aalen (DE); Alexander Epple, Aalen (DE); Helmut Beierl, Heidenheim an der Brenz (DE); Reiner Garreis, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/434,952

(22) Filed: May 8, 2003

(65) Prior Publication Data

US 2004/0017554 A1 Jan. 29, 2004

(30) Foreign Application Priority Data

May 14, 2002 (DE) ........................................ 102 21 386

(51) Int. Cl.$^7$ ........................... G03B 27/54; G02B 3/00; G02B 9/00
(52) U.S. Cl. ........................... 355/67; 359/349; 359/754
(58) Field of Search ........................... 355/67; 359/349, 359/359, 754

(56) References Cited

U.S. PATENT DOCUMENTS

| | | | |
|---|---|---|---|
| 5,488,229 A | | 1/1996 | Elliott et al. |
| 5,559,338 A | | 9/1996 | Elliott et al. |
| 5,856,884 A | | 1/1999 | Mercado |
| 5,880,817 A | | 3/1999 | Hashimoto |
| 5,920,379 A | | 7/1999 | Matsuyama |
| 5,930,049 A | * | 7/1999 | Suenaga et al. ............. 359/650 |
| 5,990,926 A | * | 11/1999 | Mercado ..................... 347/258 |
| 6,058,739 A | | 5/2000 | Morton et al. |
| 6,075,607 A | | 6/2000 | Jimbo et al. |
| 6,084,723 A | * | 7/2000 | Matsuzawa et al. ........ 359/754 |
| 6,104,544 A | | 8/2000 | Matsuzawa et al. |
| 6,198,576 B1 | | 3/2001 | Matsuyama |
| 6,259,508 B1 | | 7/2001 | Shigematsu |
| 6,349,005 B1 | | 2/2002 | Schuster et al. |
| 2002/0149855 A1 | | 10/2002 | Schuster |

FOREIGN PATENT DOCUMENTS

| | | |
|---|---|---|
| DE | 19855108 A1 | 5/2000 |
| DE | 19855157 A1 | 5/2000 |
| DE | 19929701 A1 | 5/2000 |
| DE | 19905203 A1 | 8/2000 |
| DE | 19942281 A1 | 11/2000 |
| EP | 0732605 A2 | 9/1996 |
| EP | 1094350 A2 | 4/2001 |
| JP | 2000171699 A | 6/2000 |
| JP | 2000171707 A | 6/2000 |
| JP | 2000235146 A | 8/2000 |
| WO | WO 00/33138 A1 | 6/2000 |

OTHER PUBLICATIONS

Mercado, et al., "Microlithographic Lenses," *SPIE*, vol. 3485, pp. 664–672, Nikon research Corporation of America, 1399 Shoreway Road, Belmont, CA 94002.

Ulrich, et al., "Trends in Optical Design of Projection Lenses for UV– and EUV–," *SPIE*, 12 pages (2000).

* cited by examiner

*Primary Examiner*—Rodney Fuller
(74) *Attorney, Agent, or Firm*—Townsend and Townsend and Crew LLP

(57) ABSTRACT

A projection exposure system is proposed which is positionable between a first object and a second object for imaging the first object in a region of the second object with light of a wavelength band having a width $\delta\lambda$ about a central working wavelength $\lambda$, wherein a relative width $\delta\lambda/\lambda$ of the wavelength band is larger than 0.002, in particular, larger than 0.005, for example, of the Hg-I-line. The projection exposure system is a so-called three-bulge system comprising three bulges having, as a whole, a positive refractive power and two waists having, as a whole, a negative refractive power. By applying suitable measures, in particular, by suitably selecting the material for the lenses forming the projection exposure system, the long-term stability of the system is increased.

39 Claims, 18 Drawing Sheets

Figure 1B:
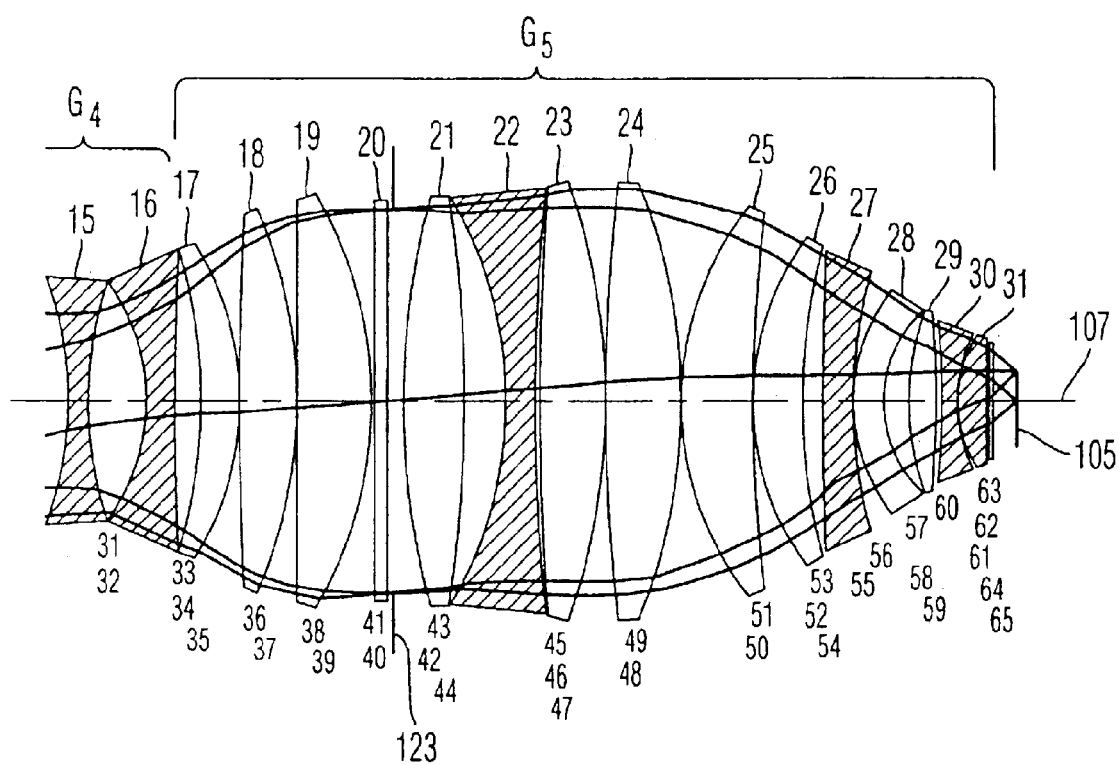

Fig. 1
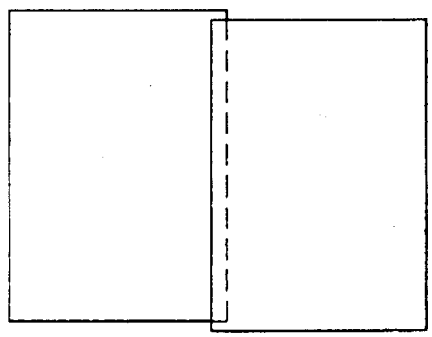
Fig. 1a  Fig. 1b
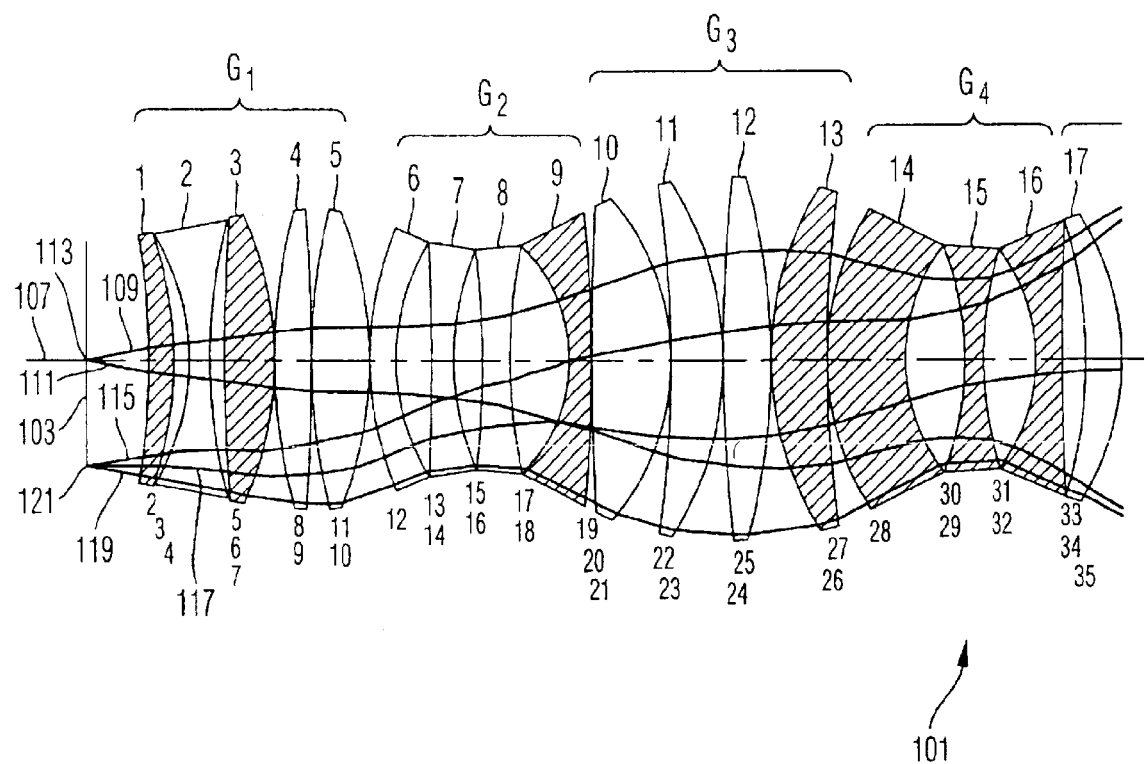
Fig. 1a

Figure 2B:
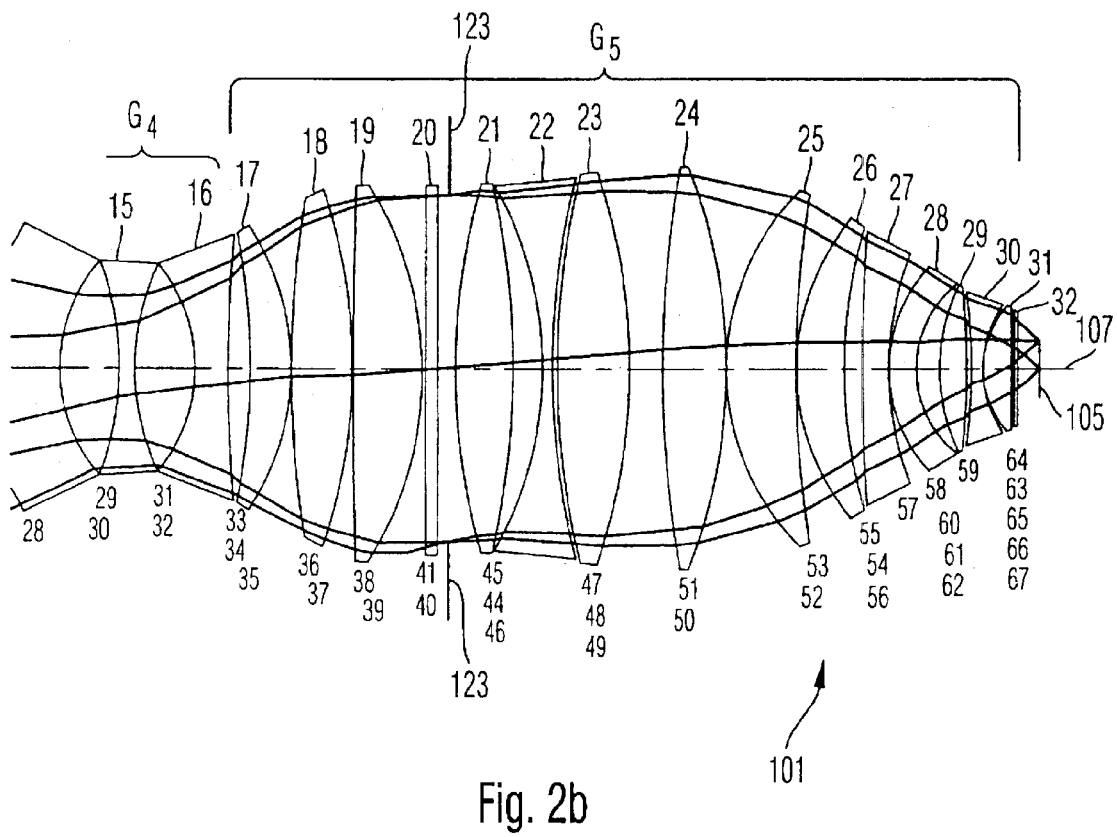

Fig. 2
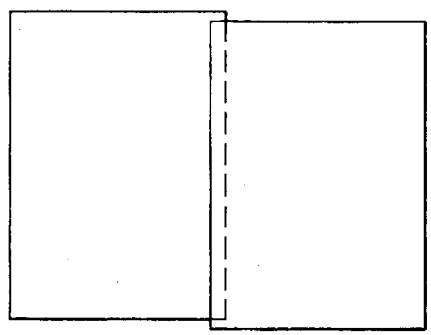
Fig. 2a    Fig. 2b
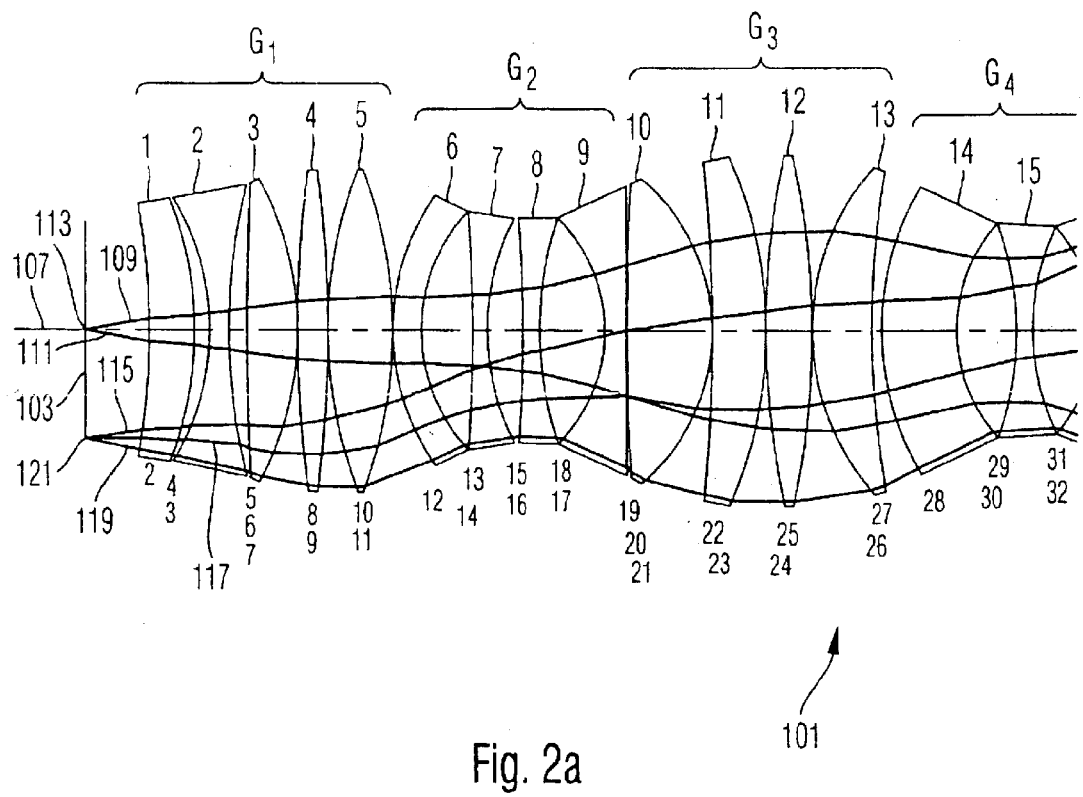
Fig. 2a

Figure 4B:
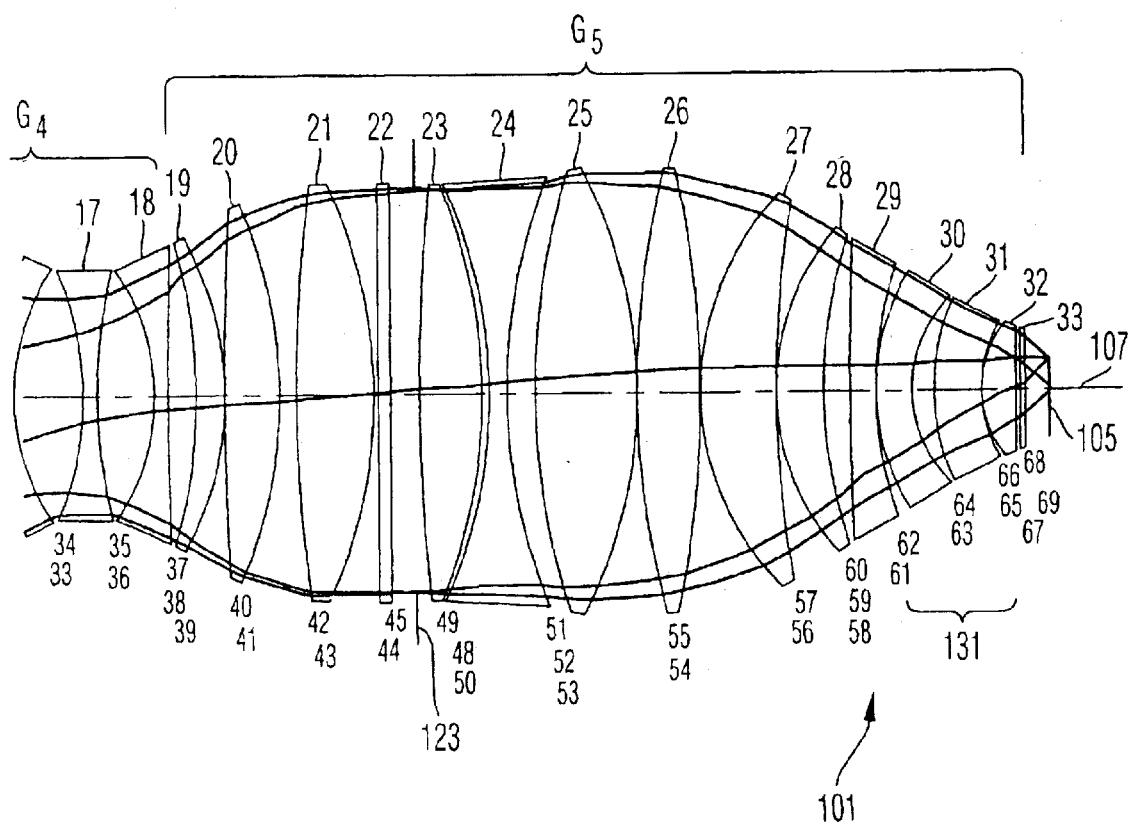

Fig. 4
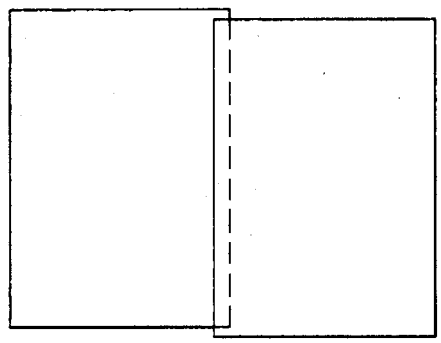
Fig. 4a  Fig. 4b
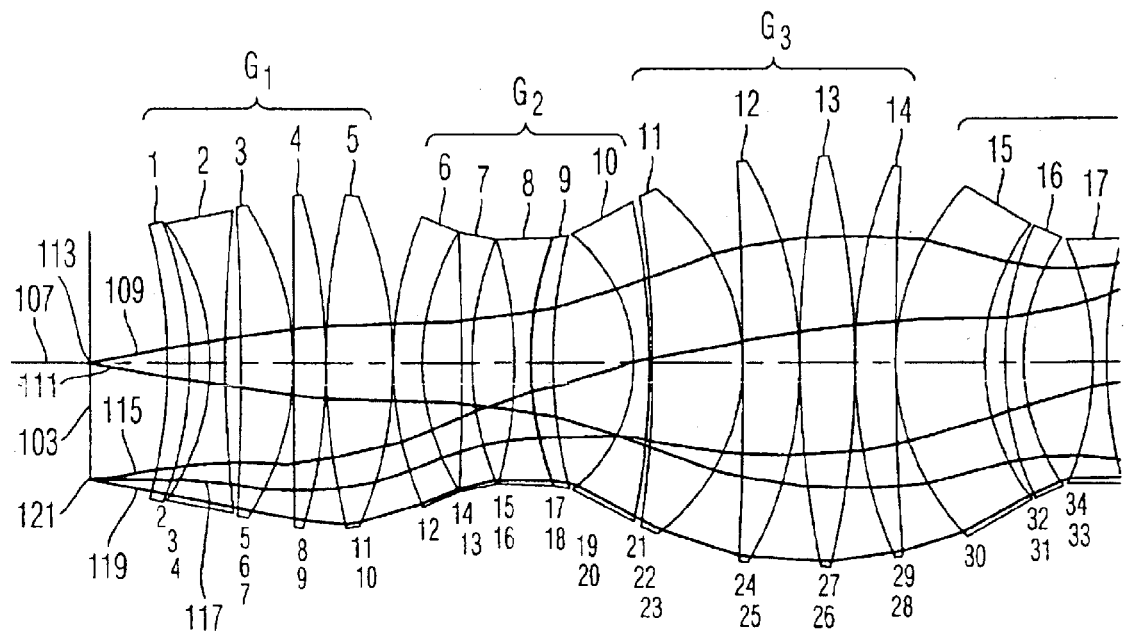
Fig. 4a

Figure 5B:
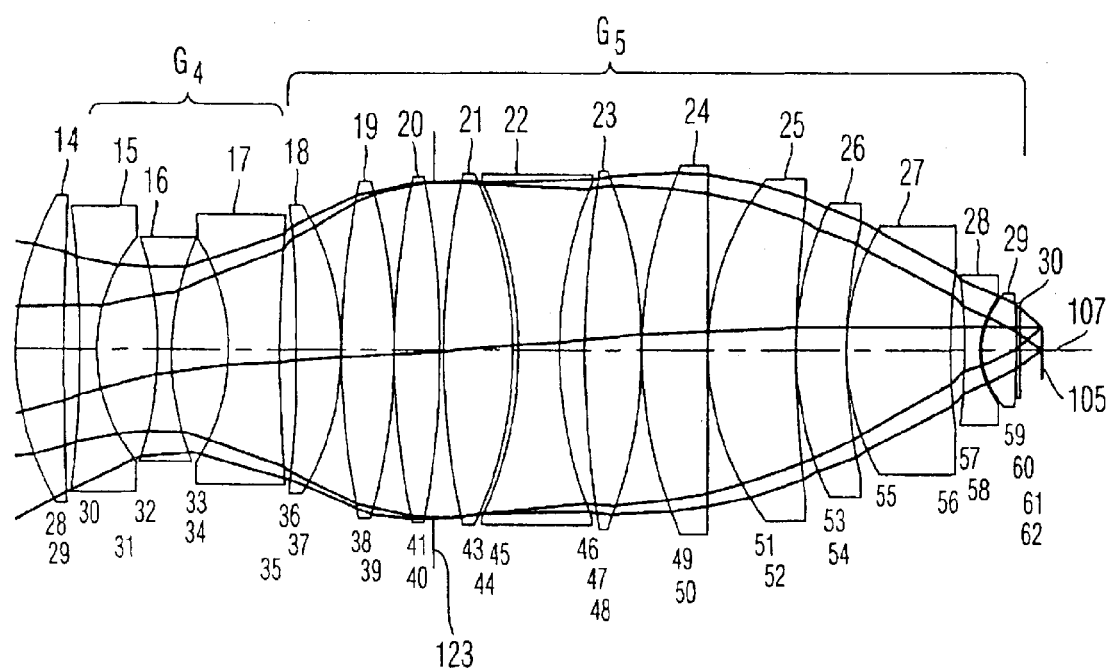

Fig. 5
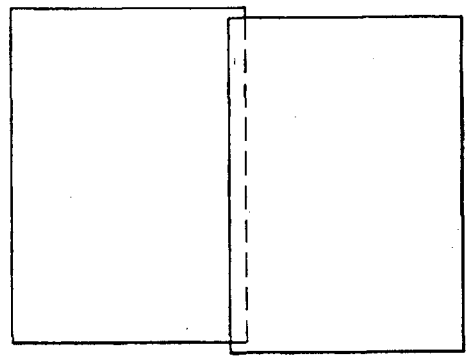
Fig. 5a   Fig. 5b
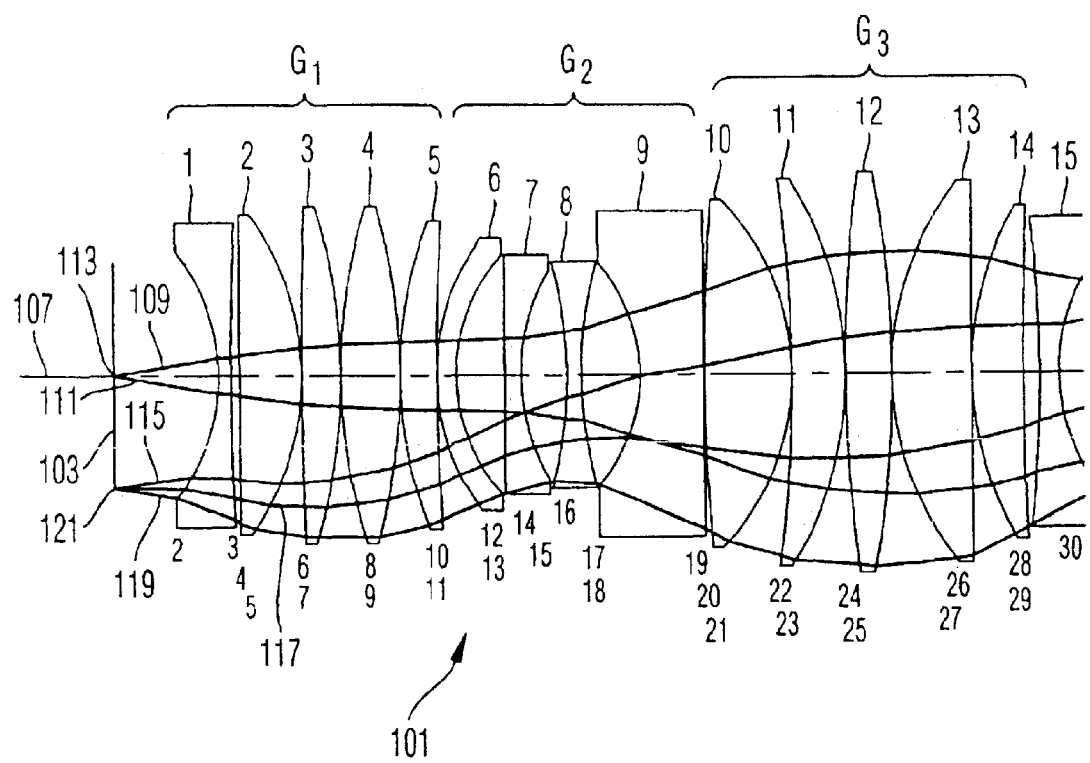
Fig. 5a

Figure 7B:
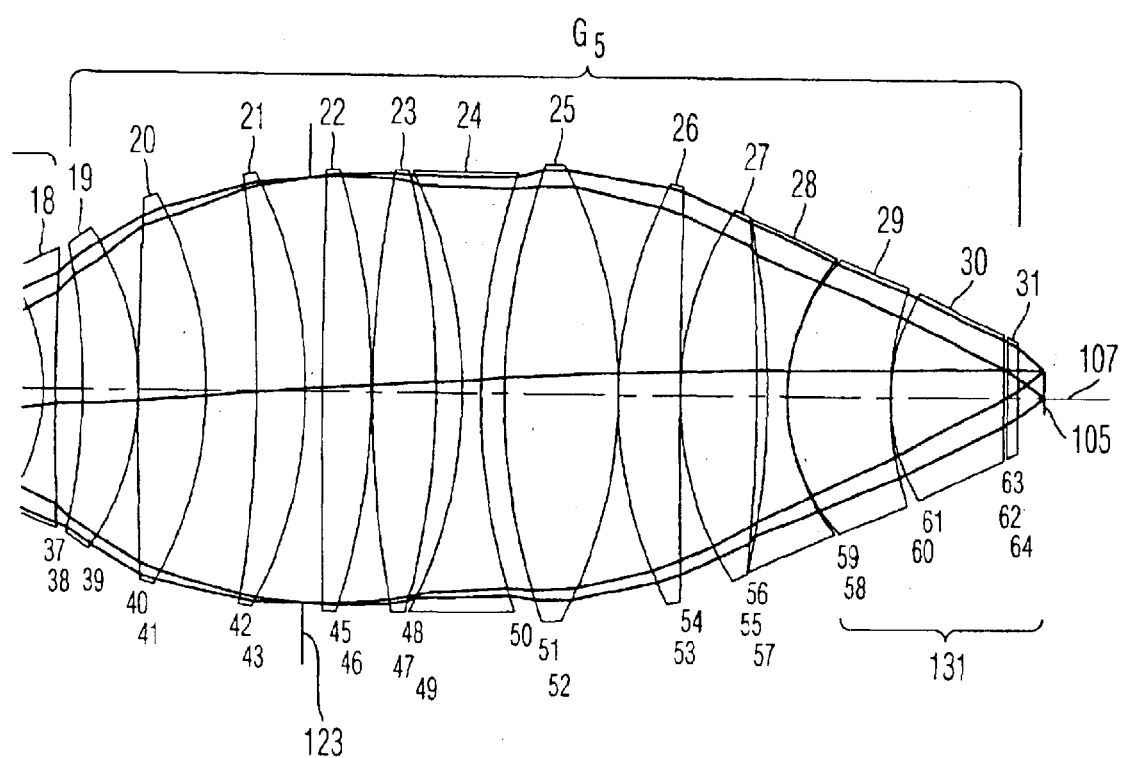

Fig. 7
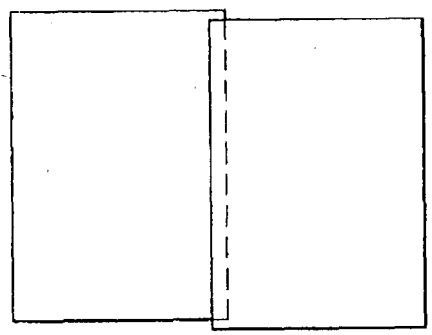
Fig. 7a    Fig. 7b
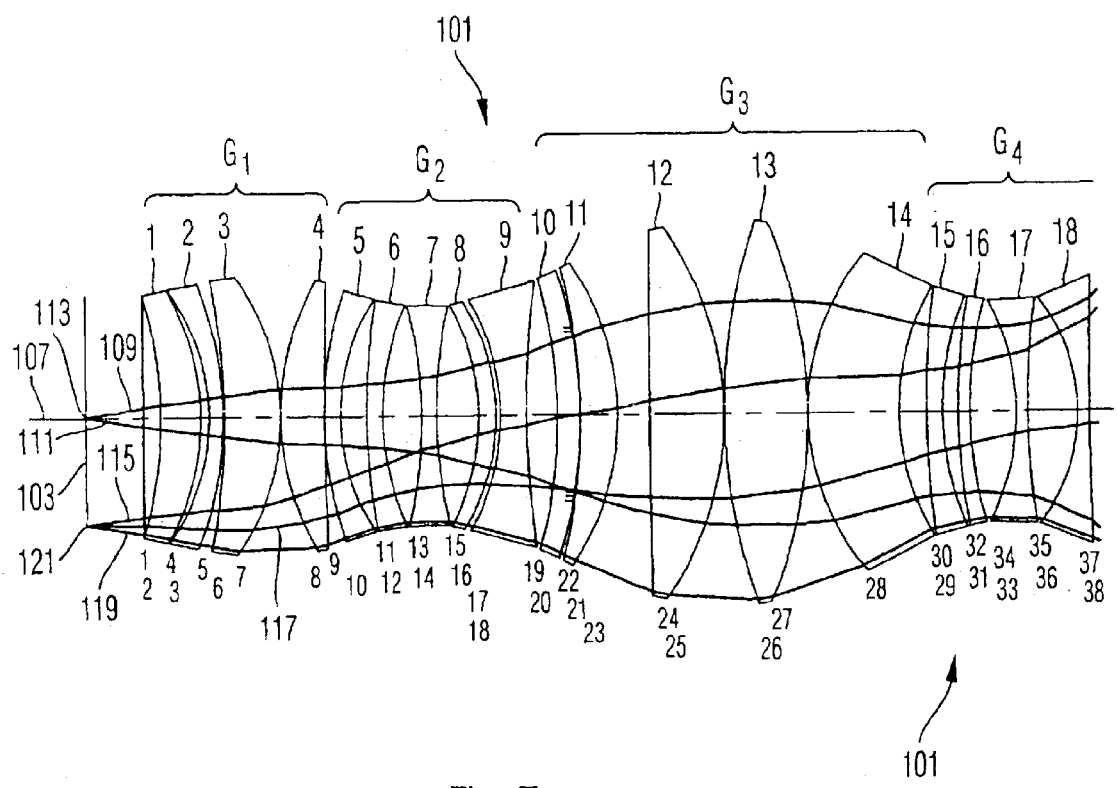
Fig. 7a

Figure 8B:
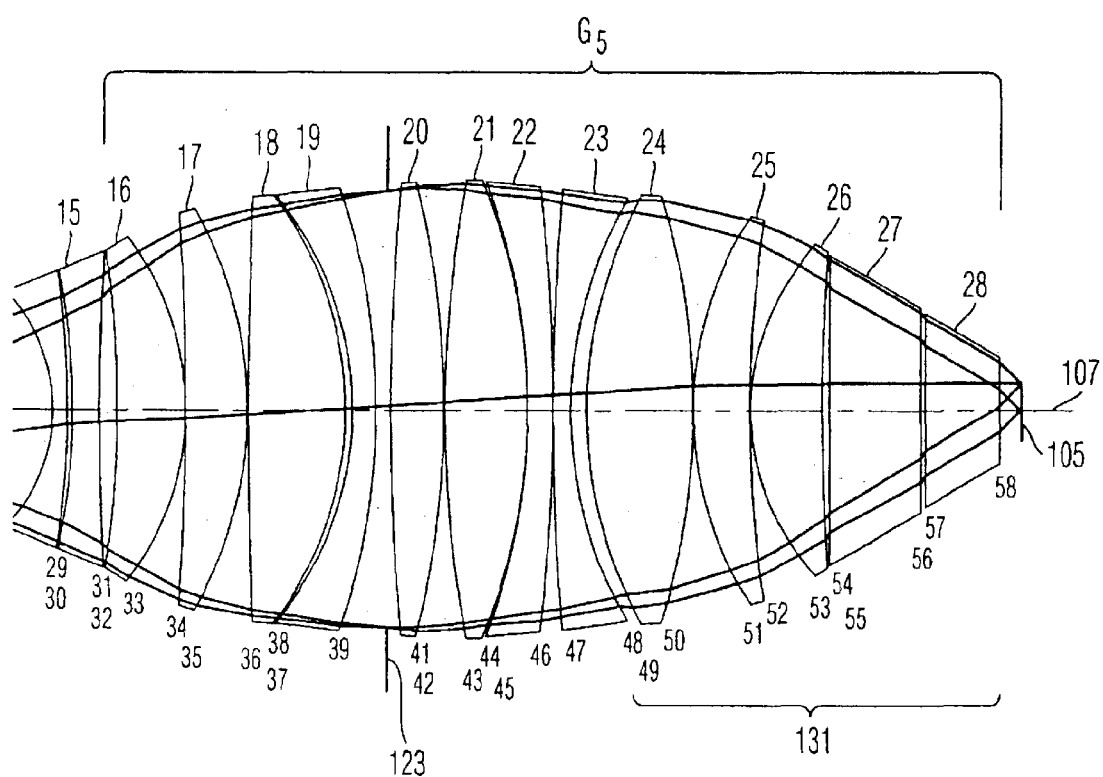

Fig. 8
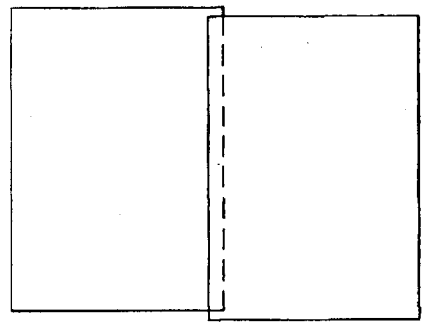
Fig. 8a    Fig. 8b
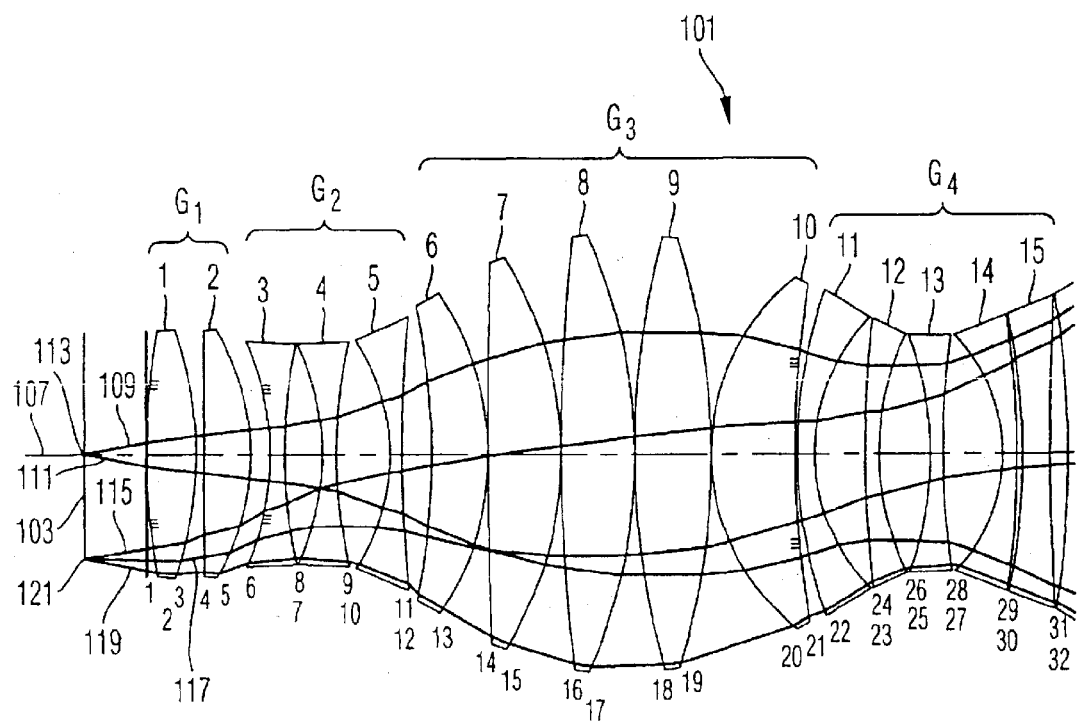
Fig. 8a

Figure 9B:
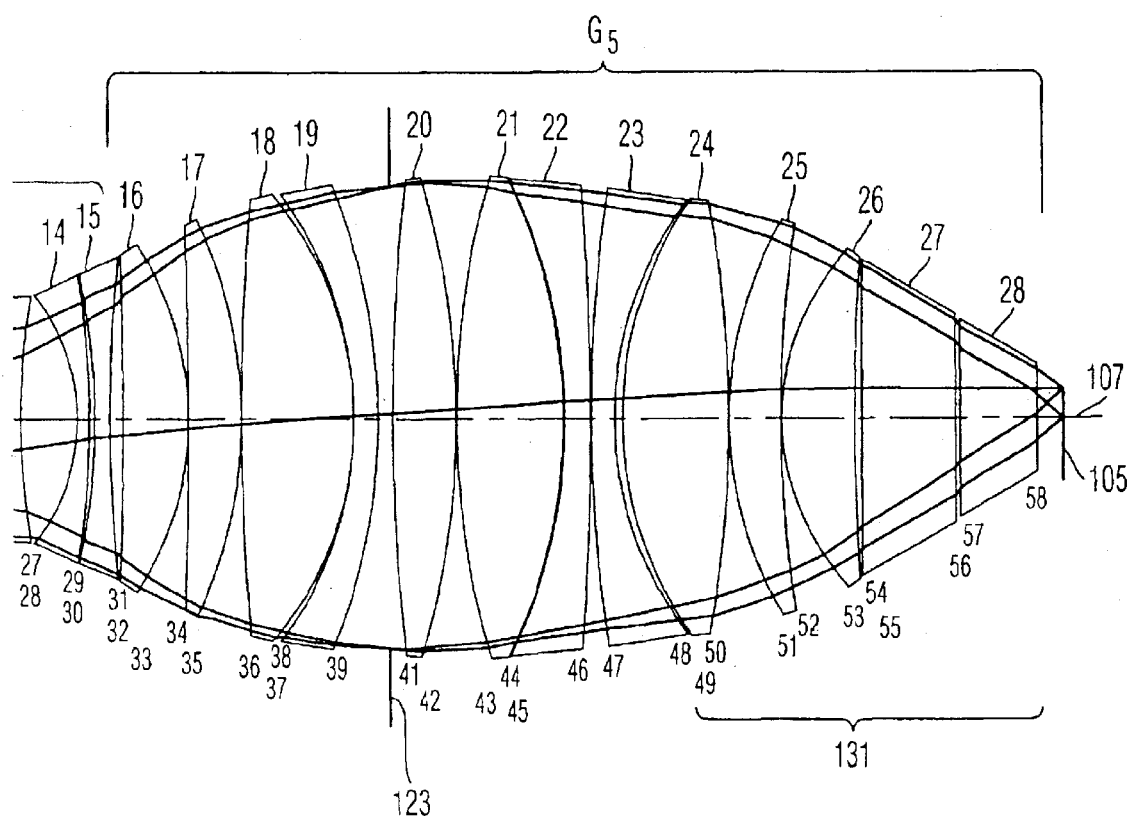

Fig. 9
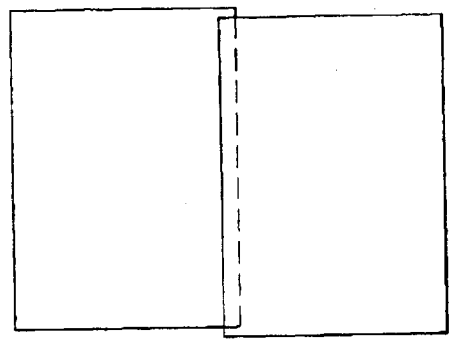
Fig. 9a    Fig. 9b
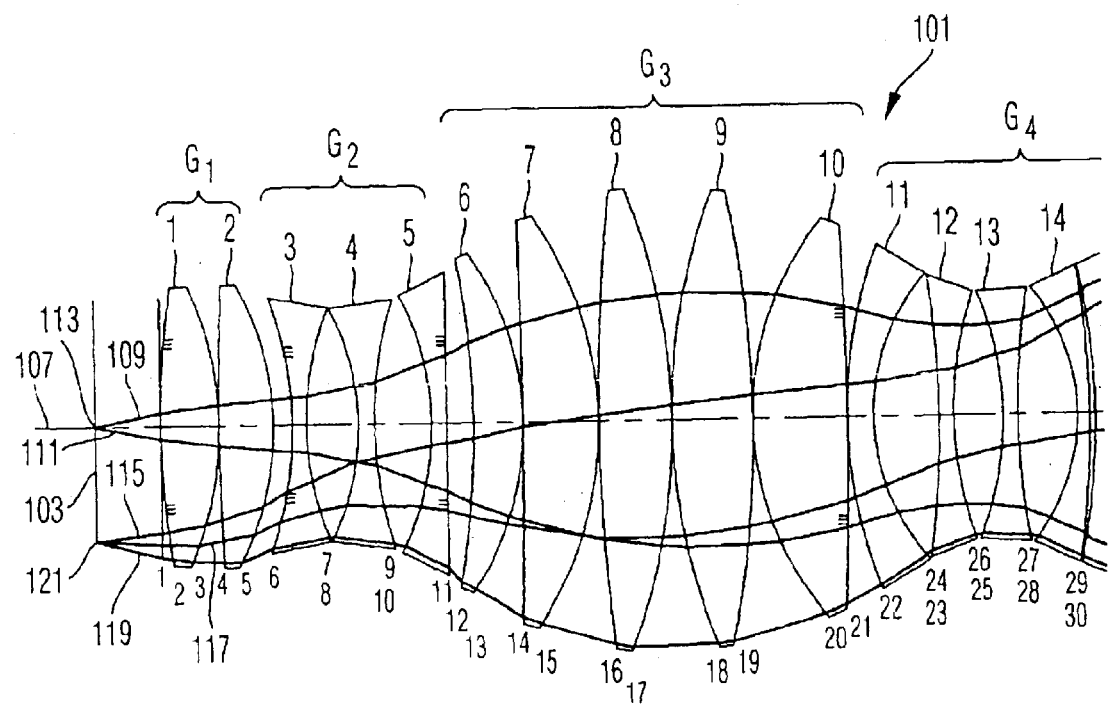
Fig. 9a

Figure 10B:
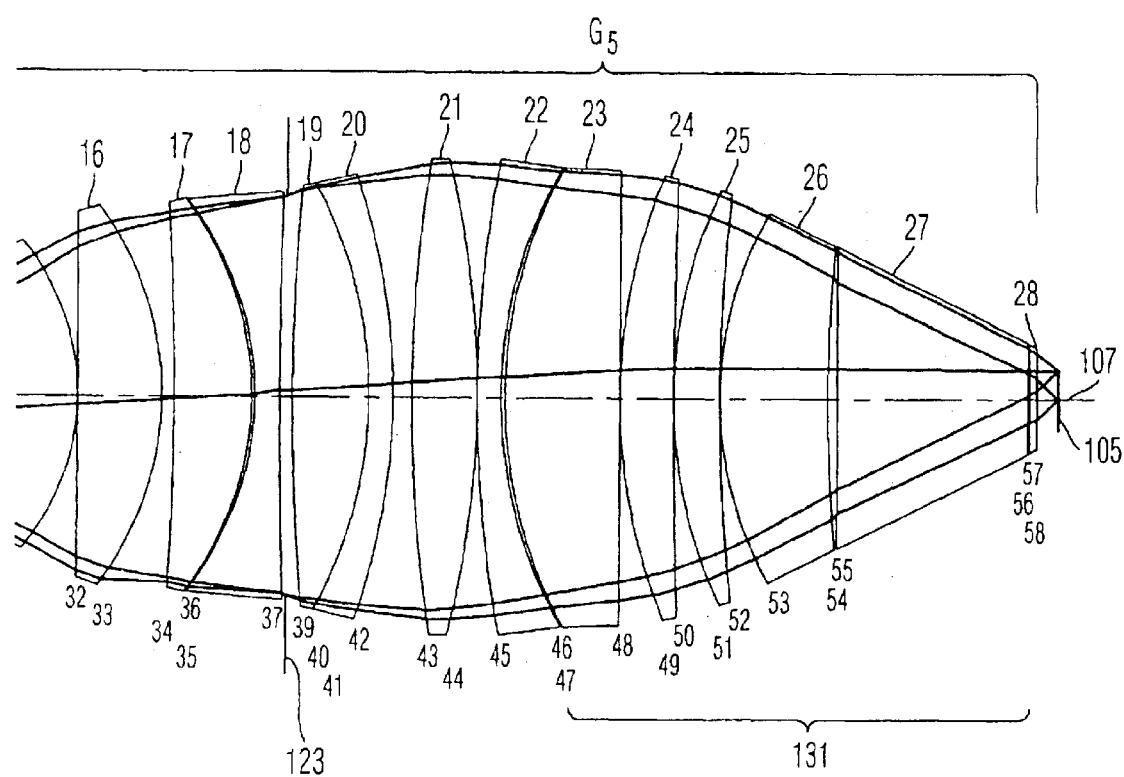

Fig. 10
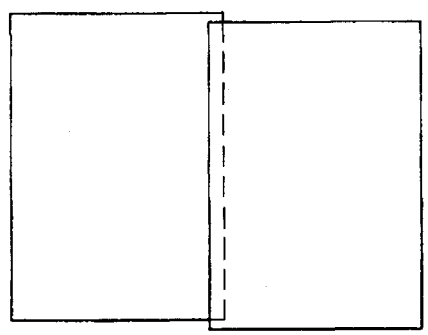
Fig. 10a    Fig. 10b
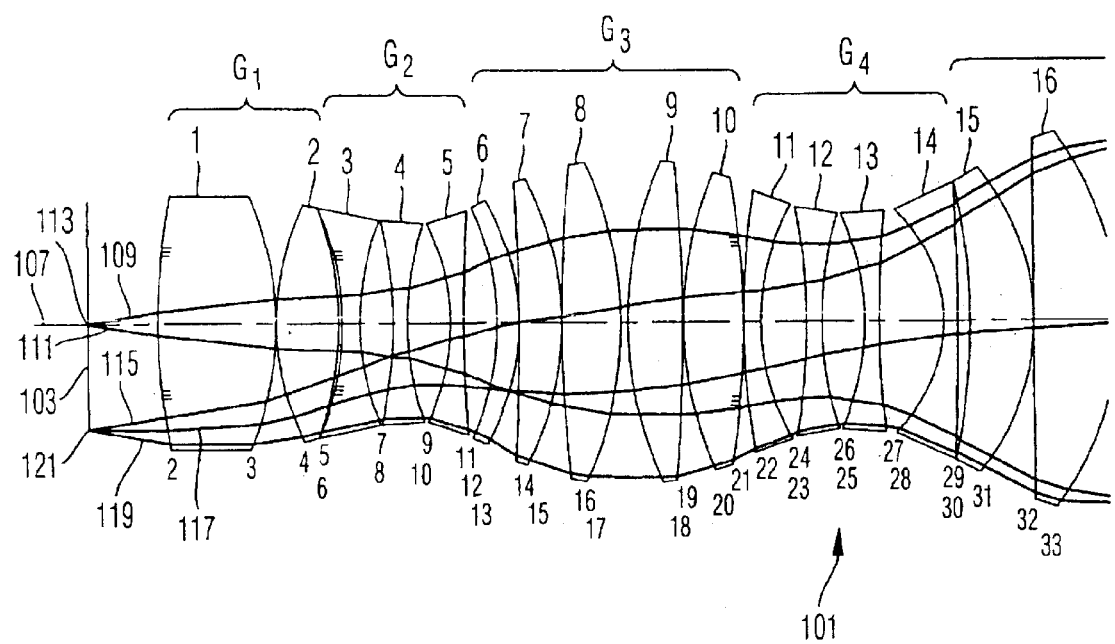
Fig. 10a

PROJECTION EXPOSURE SYSTEM

The invention relates to a projection exposure system for imaging a first object in a region of a second object. In particular, the projection exposure system is provided to be used in a process, in particular, in a lithographic process for manufacturing miniaturized devices. Accordingly, the projection exposure system is configured to enable an imaging with comparatively high resolution and correspondingly high numerical aperture.

In a conventional step of a lithographic process, an image of the geometry of the structure to be produced is provided as the first object or a mask or reticle. The mask is illuminated with light of a first wavelength band having a width $\delta\lambda$ about a central working wavelength $\lambda$. With this light, the projection exposure system images the mask on the second object which is usually a wafer coated with a radiation-sensitive layer or resist. After having been exposed, the radiation-sensitive layer is subjected to further lithographic steps in order to form the miniaturized structures in the wafer in further process steps. The imaging of the mask on the radiation-sensitive layer is usually effected reduced in size, for example, with a scale of 4:1.

The present projection exposure system is particularly configured for effecting the illumination and imaging with light of a relatively wide wavelength band. Accordingly, the objective must have a relatively high chromatic correction in order to ensure also with such wide wavelength bands a highly resolved and sufficiently error-free imaging. A relative width $\delta\lambda/\lambda$ of the wavelength band particularly aimed at is larger than 0.005. As a result, the projection exposure system is particularly suited for light of the Hg-I line which comprises light of a spectrum of a wavelength band of 365.5 nm ±2 nm. However, the present projection exposure system is not limited to the use of the Hg-I line. Rather, the use of other radiation sources and thus other wavelength bands is contemplated as well.

FIG. 1 schematically shows a beam path through an earlier design of a projection exposure system or objective 101 for imaging a mask positionable in an object plane 103 at an image plane 105. The conventional objective 101 is provided for imaging with the Hg-I line and a wavelength $\lambda$ of 365.5 nm, the imaging being effected with a demagnification of 4 to 1 and a numerical aperture NA=0.65. A plurality of lenses is disposed along an optical axis 107. In FIG. 1, a continuous numbering of the lenses is indicated above the same proceeding from an object plane 103 to an image plane 105. Below the lenses, there is indicated a continuous numbering of the refractive surfaces of the lenses in the same order. Here, the lens surface of the first lens disposed towards the object plane 103 is designated by 2. The surface of said lens disposed towards the image plane 105 is designated with 3 and the lens surface of lens 2 disposed towards the object plane 103 is designated by 4 etc.

In FIG. 1 there is further indicated: an upper marginal beam 109 as well as a lower marginal beam 111 of a field point 113 disposed on the optical axis 107 and an upper marginal beam 115, a main beam 117 and a lower marginal beam 119 of an outermost field point 121, respectively. Furthermore, a system diaphragm 123 is shown wherein the upper marginal beams 109 and 115 of the central field point 113 and the outermost field point 121, respectively, approximately intersect. The lower marginal beams 111 and 119 of the field points 113 and 121, respectively, approximately intersect therein as well.

As is evident from FIG. 1, the depicted objective is a so-called "three-bulge system". This means that beam cross-sections of the imaging light comprise three expanded portions and, accordingly, two constricted portions disposed between the expanded portions. These constricted portions are referred to as beam waists, whereas the expanded portions are referred to as beam bulges. This beam path with three bulges and two waists is formed by accordingly arranging lens groups successively, wherein the lens groups in which the beam path is bulged predominantly provide a positive refractive power and, correspondingly, lens groups in which the beam path is constricted predominantly provide a negative refractive power. In FIG. 1, these lens groups are referred to hereafter as $G_1$, $G_2$, $G_3$, $G_4$ and $G_5$, the lens groups $G_1$, $G_3$ and $G_5$ providing a positive refractive power and the lens groups $G_2$ and $G_4$ providing a negative refractive power.

The lenses indicated in hatched outline with lens numbers 1, 3, 9, 13, 14, 15, 16, 22, 27, 30 and 31 are made of a high-dispersion material similar to a flint glass. The other lenses 2, 4, 5, 6, 7, 8, 10, 11, 12, 17, 18, 19, 21, 23, 24, 25, 26, 28 and 29 are made of a low-dispersion material similar to a crown glass.

Although, according to calculations, the above-described earlier design of a projection exposure system exhibits satisfactory imaging properties as far as the numerical aperture and aberrations are concerned, comparative experiments performed on components of the system showed that the quality of the imaging through the components and the system, respectively, could diminish during operation in the course of time, in particular, when a high production rate is applied in the exposure of wafers, for example.

Accordingly, it is an object of the present invention to provide a projection exposure system of the above-described type which provides specific imaging properties with increased stability over time.

In this respect, the invention proceeds from a projection exposure system positionable between a first object and a second object for imaging the first object in a region of the second object with light of a wavelength band which has, in particular, a relative width $\delta\lambda/\lambda$ of more than 0.002, preferably, of more than 0.005. Such a width of the wavelength band is relatively large in so far as specific wavelength bands of radiation which is likewise conventionally applied in lithography and which is, for example, provided by lasers, are considerably narrower.

Furthermore, the projection exposure system is a so-called three-bulge system, that is, it comprises five lens groups, wherein, in the order of the arrangement of the lens groups between the first object and the second object, each one of a first, a third and a fifth lens group has, as a whole, a positive refractive power, and each one of the lens groups respectively disposed therebetween, that is, the second and the fourth lens group, each has, as a whole, a negative refractive power.

Due to the wide wavelength band to be used, the projection exposure system exhibits a chromatic correction. To this end, the materials used to manufacture the individual lenses are selected from two material groups. A first material group thereof comprises materials having Abbe numbers which are higher than a limit value and, accordingly, materials of a second material group have Abbe numbers which are lower than the limit value. This means, that materials of the first material group have a lower dispersion than materials of the second material group. At least one of the lenses of the projection exposure system is made of a material of the first material group and has a positive refractive power, whereas at least another one of the lenses of the projection exposure system is made of a material of the second material group and has a negative refractive power.

The invention is based on the finding that certain glasses suitable for use at the predetermined working wavelength have a reduced long-term stability than other ones of such glasses. Due to the light passing through the lens material during operation, changes occur in the lens materials which can also change the optical properties of the lenses. Known mechanisms of such a kind are mechanisms known as "compaction", "lens heating" or also "solarization". It has now been found that, in particular, those glasses exhibit a reduced long-term stability which have a relatively high refractive index and a high dispersion.

Based on this finding, the invention is distinguished, according to a first aspect, in that, within the fifth lens group, that is, the lens group disposed closest to the second object, there is provided a partial group of at least three directly successively arranged lenses which are made of a material included in the first material group. In particular, this partial group comprises those lenses of the fifth lens group which are disposed relatively close to the second object. In particular, said partial group also comprises that lens of the projection exposure system which is disposed as terminal lens closest to the second object. According to the invention, this does not conflict with the fact that certain further elements, such as a protective plate or the like, which are traversed by the beam path and have a comparatively small optical effect are disposed between such a terminal lens and the second object. This may be, for example, a plane-parallel plate or a lens having a low refractive power which has a thickness on the optical axis of less than 1% of a distance between the first object and the second object. Such a plane-parallel plate provides a certain spherical overcorrection as optical effect and thus reduces certain image errors, such as the spherical aberration.

The lenses of the fifth lens group close to the second object have a small diameter as compared to other lenses of the system. Accordingly, the entire illumination intensity is passed through a relatively small cross-sectional area so that relatively high radiation densities are encountered in this region of the system. Accordingly, the lenses close to the second object are particularly susceptible to deteriorations of the optical properties thereof at long operation times, because it has been found that the change in the optical properties increases as the radiation density and the illumination time increases. According to the invention, these lenses are not made of materials of the second material group. The materials of the second material group, whose Abbe numbers are smaller than those of the first material group have mostly a higher refractive index than the materials of the first material group. At the same time, the materials of the second material group often exhibit a higher absorption than those of the first material group. Accordingly, the materials of the second material group are mostly more susceptible to changes caused by a high radiation load. Now, as the lenses of the projection exposure system which are close to the second object are made of materials of the first material group, the system exhibits a long-term stability which is increased as compared to the conventional system.

The partial lens group which is disposed close to the second object and made of materials of the first material group comprises as many lenses as possible, in particular, four lenses, preferably, five lenses and, still further preferred, at least six lenses.

Preferably, the portion of materials of the second material group is as low as possible in the system as a whole as well. Nevertheless, a certain portion of lenses which is made of materials of the second material group is necessary in order to provided a desired chromatic correction. It has been found to be favorable that the materials of the second material group used in the system account for less than 20 percent, preferably, less than 15 percent, referred to a volume portion of the processed materials of the first material group.

In light of the necessary chromatic correction, it is, however, not possible to make all lenses of the fifth lens group of materials of the first material group. It is thus necessary to provide, after the partial group made of materials of the first material group, at least one lens which is made of a material of the second material group. It has been found to be favorable for this lens made of the material of the second material group to have a free diameter which is as large as possible so that, due to the relatively large diameter, the radiation density is reduced at the location of this lens.

By free diameter of a lens, it is understood the diameter within the lens which is maximally available to a beam path traversing the objective. Accordingly, the free diameter of a lens basically corresponds to the overall diameter minus the region covered, for example, by the lens mount.

In regard to a maximum free diameter $D_{max}$ of all lenses used in the system, the lens adjacent to the partial group and made of the material of the second material group has a free diameter which is larger than 0.7 times $D_{max}$ and which is preferably larger than 0.8 times $D_{max}$.

Furthermore, it has been found to be favorable for lenses made of the second material group which are indispensable for chromatic correction to be disposed at locations in the beam path of the system where there is a radiation intensity which is distributed across the cross-sectional area as homogeneously as possible. Preferably, such locations are located in a region along the optical axis wherein bundle cross-sections of beams emanating from different field points of the first object are displaced from each other to a relatively little degree. It has been found to be favorable for this region to be selected such that the displacement of two beam bundles, relative to the free diameter, has a value of less than 0.1, one of said beam bundles emanating from a first outermost field point at the first object and a second one emanating from an outermost field point which is diametrically opposed to the first field point.

This region usually includes the location where a system diaphragm is disposed. Furthermore, it has been found to be advantageous for the region to be selected such that such a displacement between the two beam bundles of two diametrically opposed outermost field points, relative to the free diameter of the two beam bundles, is smaller than 0.05 at locations which are disposed between the system diaphragm and the second object.

By fabricating the lenses of the partial group disposed close to the second object of materials of the first material group which exhibit a relatively low susceptibility to radiation-induced changes, it is possible and preferably also provided for that at least one lens of this partial group is formed as a particularly thick lens because with such thick lenses it is also possible to correct specific aberrations. Accordingly, at least one lens of the partial group has preferably a maximum thickness along the optical axis which is larger than 0.3 times and preferably larger than 0.45 times the free diameter of this lens.

Furthermore, it has been found that lenses of the fourth lens group, too, that is, lenses of the second beam waist are sensitive to radiation-induced changes. On the other hand, the second beam waist is also a place where lenses having a negative refractive power and made of materials of the second material group are disposed, said lenses being necessary for the required chromatic correction.

According to a second aspect of the invention, it is provided for in a projection exposure system which comprises in its second beam waist lenses made of the second material group that said lenses are at least made of a material whose refractive index is smaller than 1.59 at a wavelength of 365.5 nm. Accordingly, at least such materials of the second material group are disposed in the second beam waist which, as compared to other materials of the second material group, have a relatively small refractive index and a lower radiation sensitivity.

As already explained above, particularly materials with a high refractive index have been found to be susceptible to radiation-induced changes. According to this aspect, the invention thus provides a projection exposure system which exhibits a relatively little susceptibility to radiation-induced changes when lenses made of materials of the second material group are disposed in the second beam waist.

It has been found to be extremely difficult to remove lenses made of materials of the second material group which are indispensable for the required chromatic correction from further regions of the projection exposure system which are different from the third bulge or fifth lens group.

According to a further aspect, the invention suggests providing lens groups which are different from the fifth lens group such that all lenses thereof are made of materials of the first material group and compensating for the thus accepted loss of chromatic correction involved therewith in that at least one lens of said lens groups has an aspherical surface. The fabrication of aspherical lens surfaces is much more complex and accordingly involves considerably higher costs than the fabrication of spherical lens surfaces. Nevertheless, in the present case, the invention offers a favorable compromise between fabrication complexity and long-term stability of the optical system. For it has been found that merely only very few lens surfaces must be aspherically in order to keep relatively large portions of the system free of lenses made of materials of the second material group. Preferably, two, in particularly, three, and more preferred, all of the lenses of the lens groups which are different from the fifth lens group comprise at most one lens with an aspherical surface. Moreover, at least one of the lens groups which are different from the fifth lens group, i.e., the first, the second, the third or/and the fourth lens group is then preferably completely free of lenses made of materials of the second material group.

In this respect, it is further preferred to provide the aspherical lens surface at such a location in the beam path where the aspherical surface has a maximum influence on the correction of aberrations. It has been found that such locations are positioned at boundaries between adjacent lens groups. Accordingly, a lens which is an outermost marginal lens on the optical axis of the respective lens group is preferably selected to have the aspherical surface. It is then further preferred to provide the aspherical surface on the side of this marginal lens which is oriented away from the lens group.

In order to define a distinction between lenses of two different lens groups, it is suggested to consider the path of an outer marginal beam of an outermost field point in the beam path. At the three bulges of the system, the path of said marginal beam is curved inwardly, i.e., towards the optical axis. Accordingly, it is curved outwardly, i.e., away from the optical axis at the two waists of the system. As a result, the path comprises a deflection point between the outwardly curved portions and the inwardly curved portions. With this approach it is in most cases possible to clearly allocate a lens in question to one of the lens groups. However, in some cases a first surface of a specific lens causes the marginal beam to be deflected away from the optical axis, while the other lens surface thereof already directs the beam towards the optical axis. Accordingly, the effect of the one surface could be allocated to the beam waist, whereas the effect of the other lens surface is allocated to the beam bulge. However, as a whole, such a lens is allocated to the beam waist or the second and fourth lens group, respectively, if the deflecting effect away from the optical axis of the one surface exceeds the deflecting effect towards the optical axis of the other lens surface and vice versa.

An alternative way of defining a distinction between lenses of two different lens groups relates to the cumulated refractive power of a lens group. Accordingly, a lens group is interpreted as a waist if it has, as a whole, a diverging effect and its overall refractive power is higher than the refractive power of that single lens of the system which has the highest diverging effect. Moreover, the amount of the overall refractive power of a waist is to be maximal, i.e., the negative overall refractive power of the lens group would increase again if lenses adjacent to the group were incorporated or a marginal lens of the lens group was omitted. In other words, this also means that the marginal lenses of a waist are each diverging lenses.

Bulges can be defined in analogous manner. They have a converging effect and have an overall refractive power which is higher than the refractive power of that single lens of the system which has the highest converging effect. Moreover, the overall refractive power of a bulge is to be maximal, i.e., the overall positive refractive power of the lens group would decrease again if lenses adjacent to the group were incorporated or a marginal lens of the lens group was omitted. In other words, this means that the marginal lenses of a bulge are each converging lenses.

As a whole, the projection exposure system comprises exactly three bulges and two waists. Only those three lens groups fulfilling the above-indicated criteria are interpreted as bulge which, among all lens groups fulfilling the above-indicated criteria, exhibit the highest positive overall refractive powers. The analogue applies to the two waists.

Preferably, all lenses of the first, second and third lens group are made of materials of the first material group. In this respect, it is even more preferred to make also all lenses of the fourth lens group of such materials.

However, good results are also obtained if the portion of lenses made of the second material group and disposed in lens groups in front of the second beam waist, that is, in the first, second or third lens group, account for a relatively small portion of the entire volume of lenses made of materials of the second material group. A favorable value is obtained if the lenses made of materials of the second material group and provided in the first, second and third lens group account for less than 10 percent, based on the entire volume of lenses made of materials of the second material group.

According to a further aspect of the invention, the fifth lens group, i.e., the lens group disposed closest to the second object, comprises a pair of lenses which in this application is referred to as pseudo-cemented lens pair. The pseudo-cemented lens pair consists of two directly adjacent lenses whose lens surfaces disposed towards each other are spaced apart from each other over their entire cross-section only by a very small distance. The distance between the two lens surfaces disposed towards each other is less than 2.50%, in particular, less than 1.25 of the free diameter of the largest one of the two lenses. One lens of the lens pair is made of a material of the first material group and has a positive refractive power, while the other lens of the lens pair is made of a material of the second material group and has a negative refractive power. The lens surface of the lens of negative refractive power which is disposed towards the other lens is a concave surface.

Preferably, the other lens surface of the lens of negative refractive power disposed away from the other lens of the pair is a convex lens surface.

Moreover, it has been found to be advantageous for two of such pseudo-cemented lens pairs to be positioned between a system diaphragm of the optical system and the second object.

In this respect, it is equally favorable for at least one of said pseudo-cemented lens pairs disposed between a system diaphragm and the second object to comprise lens surfaces disposed towards each other which are curved such that the centers of curvature of the two lens surfaces disposed towards each other are positioned on the side of the second object. Moreover, it has likewise been found to be favorable for the lens surfaces disposed towards each other of a pseudo-cemented lens pair which is disposed between a system diaphragm and the first object to be curved such that the centers of curvature of the lens surfaces disposed towards each other are positioned on the side of the first object.

A favorable configuration of the system is obtained if a diaphragm is disposed in the region of the fifth lens group.

Moreover, the system is particularly suited for use of light of the Hg-I line.

The materials referred to herein as materials of the first material group preferably have a refractive index, measured at a wavelength of 365.5 nm, which is smaller than 1.55 and further preferred smaller than 1.53.

Accordingly, the glass of the company SCHOTT, Mainz, Germany, referred to as FK5 at the date of application is included in the first material group. Another definition of the first material group is thus possible in that all materials of the first material group have a refractive index which is smaller than 1.03 times that of the FK5 glass.

Vice versa, as materials of the second material group are selected such materials which have a refractive index at a wavelength of 365.5 nm which is higher than 1.54. Thus, in particular, the glass of the company SCHOTT referred to as LLF1 is included in the second material group. An alternative definition of the materials of the second material group is thus given in that all materials of the second material group are in a refractive index range which starts at 0.97 times the refractive index of the LLF1 glass and terminates at 1.07 times this refractive index.

However, the glass of SCHOTT referred to, at the date of application, as LF5 is, preferably, not contained in the second material group. Accordingly, an upper limit of the refractive index of the materials of the second material group can be defined by the refractive index of SCHOTT's LF5 glass. Accordingly, the materials of the second material group have a refractive index at the wavelength 365.5 nm which is smaller than 1.64 and which is, in particular, smaller than 1.59.

The limit value Vg which distinguishes materials of the first material group from that of the second material group as regards their Abbe numbers is preferably in the middle between the Abbe numbers of the FK5 and LF5 glasses of SCHOTT. Preferably, this limit value Vg is 400 if the Abbe number is determined at the wavelength $\lambda$=365.5 nm and a wavelength difference $\Delta\lambda$ of 3 nm.

Furthermore, the first material group preferably comprises quartz glass.

With a view to high-resolution applications, the numerical aperture of the system on the side of the second object is larger than 0.60, preferably, larger than 0.65 and, most preferred, larger than 0.70.

The quality of the optical imaging can likewise be characterized by the so-called Strehl number. For the present projection exposure system, the Strehl number is preferably higher than 0.95 and further preferred higher than 0.98.

Furthermore, such a high-resolution system is distinguished in that, at a given distance between the first object and the second object, there are provided relatively many lenses in order to keep the optical loads which the individual lens surfaces are subjected to, i.e., the beam deflections produced by the individual lens surfaces, as low as possible. Preferably, shortest distances of adjacent lens surfaces, that is, distances between lenses measured, depending on the lens type, on the optical axis or the lens edges are therefore smaller than 25 mm and further preferred less than 20 mm. Shortest distances between opposite lens surfaces, averaged over the projection exposure system, are smaller than 3 mm, preferably smaller than 1.5 mm.

In order to render the projection exposure system largely insensitive to slight misalignments between the first and the second object, the projection exposure system is preferably provided telecentrically on both sides.

Figure 3:
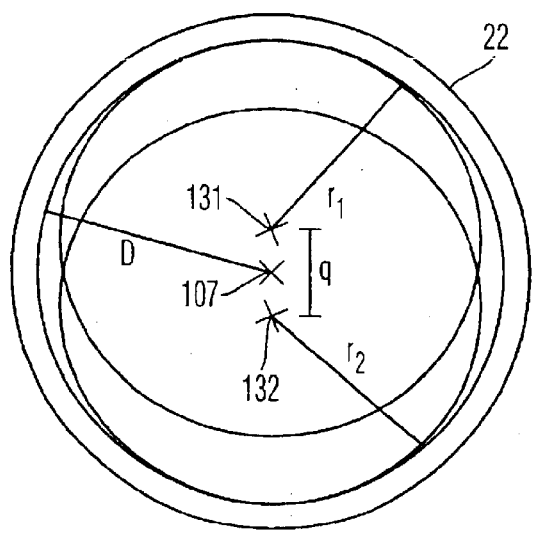
Figure 6:
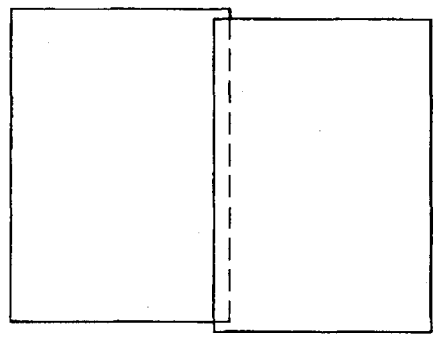
Figures 6A, 6B:
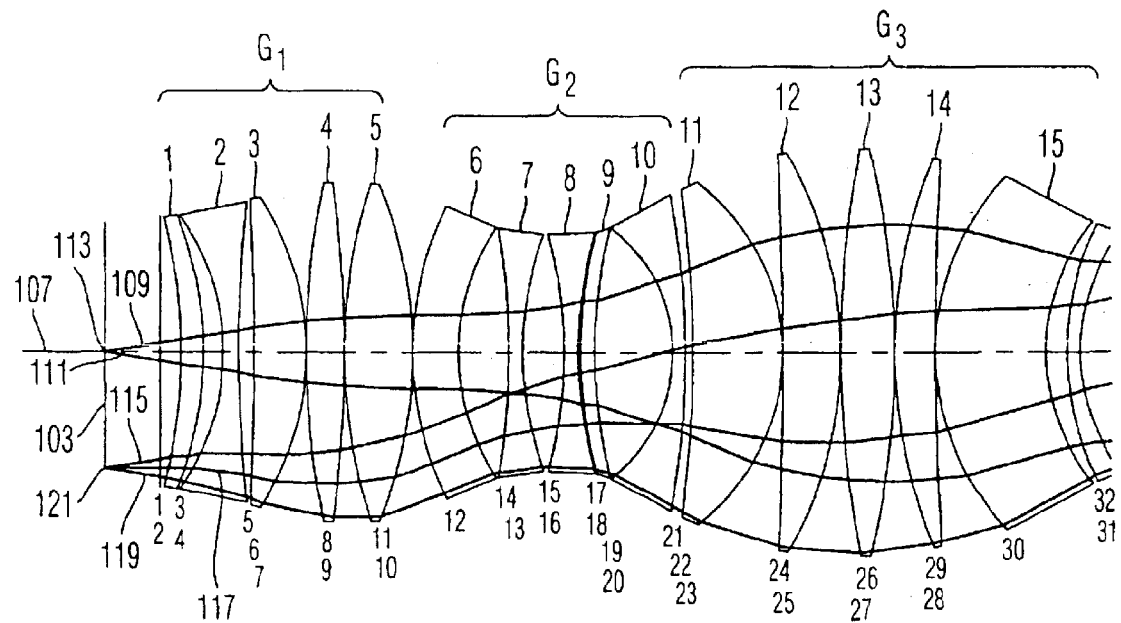
Figure 6A:
Figure 6B:
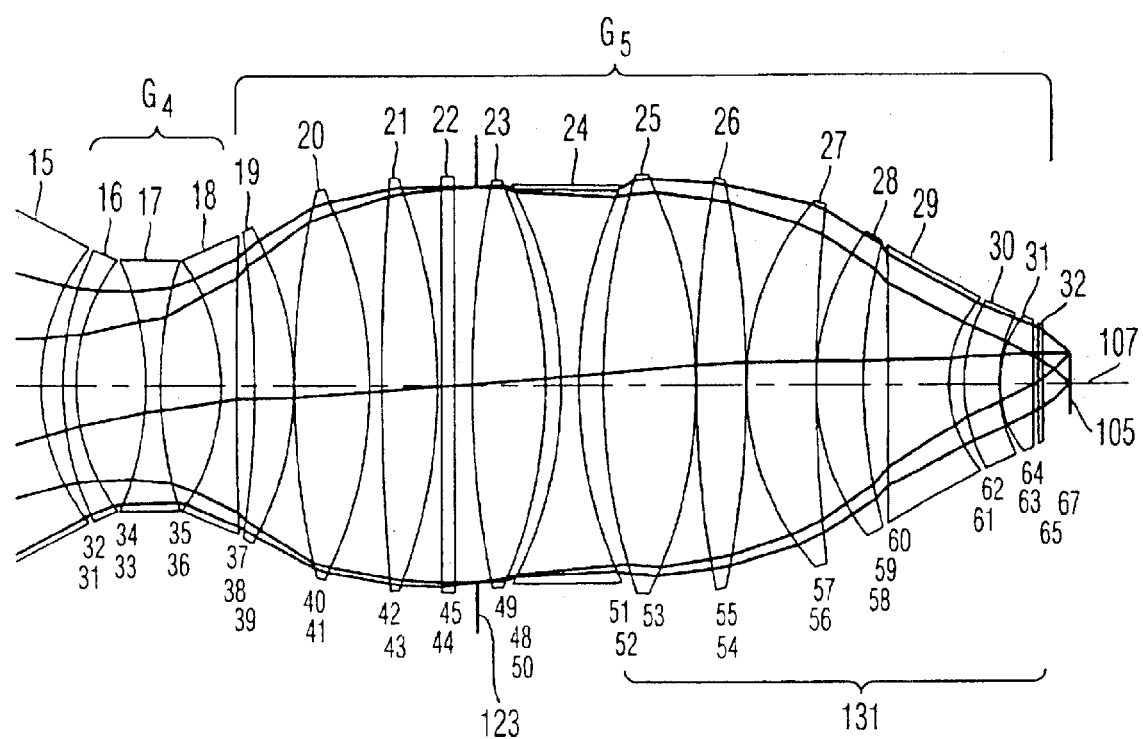

Embodiments of the invention are described hereinafter with reference to Figures, wherein FIG. 1 shows an earlier design of a projection exposure system, FIG. 2 shows a first embodiment of a projection exposure system according to the invention, FIG. 3 shows a cross-section through a beam path of a projection exposure system for illustrating a displacement of beam bundles, FIG. 4 shows a second embodiment of a projection exposure system according to the invention, FIG. 5 shows a third embodiment of a projection exposure system according to the invention, FIG. 6 shows a fourth embodiment of a projection exposure system according to the invention, FIG. 7 shows a fifth embodiment of a projection exposure system according to the invention, FIG. 8 shows a sixth embodiment of a projection exposure system according to the invention, FIG. 9 shows a seventh embodiment of a projection exposure system according to the invention, and FIG. 10 shows an eighth embodiment of a projection exposure system according to the invention.

An embodiment of the projection exposure system according to the invention is illustrated in FIG. 2.

Optical data of the projection exposure system shown in FIG. 2 are indicated below in Table 1, wherein the first column indicates the numbering of the respective refracting surfaces, the second column indicates the radii of curvature of the refracting surfaces, the third column indicates the axial distances between adjacent refracting surfaces, the fourth column indicates the material which is disposed between the refracting surfaces, the fifth column indicates the refractive index of this optical material measured at a wavelength of 365.5 nm and the sixth column indicates half of the free diameter of the lens allocated e respective refracting surface. The glasses used for the objective 101 are obtained by the company SCHOTT and, accordingly, SCHOTT's respective product names (state: autumn 2001) are indicated in the fourth column as glass type:

TABLE 1

| Surface | Radii | Thicknesses | Medium | Refractive index | ½ free diameter |
|---|---|---|---|---|---|
| 0 | 0.000000000 | 32.000000000 | | 1.00000000 | 59.000 |
| 1 | 0.000000000 | 3.410700000 | | 1.00000000 | 64.523 |
| 2 | −407.431645000 | 24.124404000 | LF5 | 1.61906768 | 64.233 |
| 3 | −190.763960000 | 9.051883000 | HE20 | 0.99976000 | 67.088 |
| 4 | −126.896809000 | 10.390974000 | FK5 | 1.50393369 | 67.174 |
| 5 | 315.746411000 | 10.170796000 | HE20 | 0.99976000 | 76.060 |
| 6 | 2642.002430000 | 26.521311000 | LF5 | 1.61906768 | 77.158 |
| 7 | −170.350740000 | 0.600000000 | HE20 | 0.99976000 | 78.941 |
| 8 | 688.779159000 | 15.251492000 | LLF1 | 1.57916392 | 83.139 |
| 9 | −828.961373000 | 0.600000000 | HE20 | 0.99976000 | 83.495 |
| 10 | 253.049406000 | 34.466538000 | FK5 | 1.50393369 | 84.172 |
| 11 | −247.629502000 | 0.500000000 | HE20 | 0.99976000 | 83.655 |
| 12 | 134.142191000 | 14.197210000 | FK5 | 1.50393369 | 70.861 |
| 13 | 95.532190000 | 27.880102000 | HE20 | 0.99976000 | 63.005 |
| 14 | −738.224398000 | 8.000000000 | FK5 | 1.50393369 | 62.611 |
| 15 | 139.763218000 | 19.067021000 | HE20 | 0.99976000 | 59.263 |
| 16 | −825.440653000 | 9.000000000 | FK5 | 1.50393369 | 59.338 |
| 17 | 189.026000000 | 36.028267000 | HE20 | 0.99976000 | 60.125 |
| 18 | −87.960623000 | 11.529505000 | LLF1 | 1.57916392 | 60.608 |
| 19 | −6356.790846000 | 0.612768000 | HE20 | 0.99976000 | 77.138 |
| 20 | 1948.324738000 | 44.976940000 | FK5 | 1.50393369 | 79.527 |
| 21 | −112.462247000 | 0.705368000 | HE20 | 0.99976000 | 82.798 |
| 22 | −882.161402000 | 27.572454000 | FK5 | 1.50393369 | 89.995 |
| 23 | −233.533951000 | 0.600000000 | HE20 | 0.99976000 | 92.374 |
| 24 | 474.300365000 | 22.466843000 | FK5 | 1.50393369 | 94.138 |
| 25 | −575.153971000 | 0.600000000 | HE20 | 0.99976000 | 93.991 |
| 26 | 139.676984000 | 32.087368000 | FK5 | 1.50393369 | 88.856 |
| 27 | 521.190488000 | 4.133506000 | HE20 | 0.99976000 | 86.351 |
| 28 | 153.134948000 | 40.740797000 | FK5 | 1.50393369 | 78.332 |
| 29 | 87.932647000 | 33.195673000 | HE20 | 0.99976000 | 58.278 |
| 30 | −186.852044000 | 8.000000000 | LLF1 | 1.57916392 | 57.642 |
| 31 | 131.053345000 | 34.321763000 | HE20 | 0.99976000 | 55.746 |
| 32 | −94.087869000 | 17.769438000 | LLF1 | 1.57916392 | 56.315 |
| 33 | 748.500214000 | 11.607438000 | HE20 | 0.99976000 | 71.079 |
| 34 | −434.234909000 | 22.494741000 | FK5 | 1.50393369 | 72.711 |
| 35 | −154.683362000 | 0.600000000 | HE20 | 0.99976000 | 77.013 |
| 36 | 537.928136000 | 31.248045000 | FK5 | 1.50393369 | 91.846 |
| 37 | −355.890330000 | 1.284344000 | HE20 | 0.99976000 | 94.426 |
| 38 | 2563.090901000 | 36.287956000 | FK5 | 1.50393369 | 98.052 |
| 39 | −199.037047000 | 1.700000000 | HE20 | 0.99976000 | 99.134 |
| 40 | 0.000000000 | 6.000000000 | SUPRA1 | 1.47447761 | 96.837 |
| 41 | 0.000000000 | 2.100000000 | HE20 | 0.99976000 | 96.506 |
| 42 | 0.000000000 | −2.100000000 | HE20 | 0.99976000 | 96.356 |
| 43 | 0.000000000 | 9.000000000 | HE20 | 0.99976000 | 96.506 |
| 44 | 314.514859000 | 31.425407000 | FK5 | 1.50393369 | 98.490 |
| 45 | −506.854040000 | 15.763950000 | HE20 | 0.99976000 | 98.200 |
| 46 | −216.541413000 | 5.000000000 | LF5 | 1.61906768 | 97.844 |
| 47 | 367.750084000 | 3.498240000 | HE20 | 0.99976000 | 101.637 |
| 48 | 389.909912000 | 38.818137000 | FK5 | 1.50393369 | 102.687 |
| 49 | −402.292074000 | 19.425707000 | HE20 | 0.99976000 | 104.102 |
| 50 | 551.171957000 | 33.360959000 | FK5 | 1.50393369 | 106.437 |
| 51 | −340.874035000 | 0.600000000 | HE20 | 0.99976000 | 106.254 |
| 52 | 132.912140000 | 37.466243000 | FK5 | 1.50393369 | 93.647 |
| 53 | 540.348303000 | 0.600000000 | HE20 | 0.99976000 | 90.723 |
| 54 | 119.075653000 | 24.827993000 | FK5 | 1.50393369 | 77.436 |
| 55 | 232.598798000 | 11.889365000 | HE20 | 0.99976000 | 72.129 |
| 56 | 1290.376947000 | 12.237054000 | LLF1 | 1.57916392 | 69.928 |
| 57 | 146.400197000 | 0.600000000 | HE20 | 0.99976000 | 58.321 |
| 58 | 73.325602000 | 14.970586000 | FK5 | 1.50393369 | 52.371 |
| 59 | 53.686391000 | 13.134189000 | HE20 | 0.99976000 | 42.587 |
| 60 | 98.428877000 | 14.235259000 | FK5 | 1.50393369 | 41.873 |
| 61 | −1373.070799000 | 3.329224000 | HE20 | 0.99976000 | 39.821 |
| 62 | −380.732215000 | 5.841963000 | FK5 | 1.50393369 | 38.039 |
| 63 | 52.895408000 | 0.600000000 | HE20 | 0.99976000 | 30.452 |
| 64 | 43.341616000 | 16.091676000 | FK5 | 1.50393369 | 29.613 |
| 65 | 1336.072484000 | 1.488402000 | HE20 | 0.99976000 | 27.286 |
| 66 | 0.000000000 | 2.000000000 | SUPRA1 | 1.47447761 | 26.229 |
| 67 | 0.000000000 | 12.000100000 | | 1.00000000 | 25.232 |
| 68 | 0.000000000 | 0.000000000 | | 1.00000000 | 14.752 |

The refractive indices of the media, namely gases and optical materials, relate to a pressure of 950 mbar at 22° C. They are normalized in respect of the refractive index n=1 of ambient air at a pressure of 1013.3 mbar at 20° C.

Therefore, due to the lower pressure and the higher temperature, it is also possible that refractive indices of n<1 result. Corresponding numerical values are inferable from Table 2.

TABLE 2

Refractive indices of the gases and optical materials of the objective calculation at different wavelength at 950 mbar and 22° Celsius as compared to ambient air at 1013.3 mbar and 20° Celsius (n = 1)

|  | L710 | LF5HL | HE20 | FK5HL | LLF1HL | SIO2HL |
|---|---|---|---|---|---|---|
| 368.15 nm | 0.999982 | 1.61802054 | 0.99976 | 1.50351719 | 1.57824125 | 1.47410903 |
| 367.20 nm | 0.999982 | 1.61837858 | 0.99976 | 1.50365701 | 1.57852927 | 1.47424480 |
| 366.25 nm | 0.999982 | 1.61874045 | 0.99976 | 1.50379801 | 1.57882024 | 1.47438171 |
| 365.50 nm | 0.999982 | 1.61902889 | 0.99976 | 1.50391017 | 1.57905206 | 1.47449062 |
| 364.75 nm | 0.999982 | 1.61931978 | 0.99976 | 1.50402309 | 1.57928578 | 1.47460025 |
| 363.90 nm | 0.999982 | 1.61965247 | 0.99976 | 1.50415198 | 1.57955298 | 1.47472539 |
| 362.80 nm | 0.999982 | 1.62008782 | 0.99976 | 1.50432024 | 1.57990246 | 1.47488874 |

Along an optical axis 107, there are successively disposed 31 lenses, each having spherical lens surfaces, followed by a plane-parallel terminal plate made of quartz glass with a thickness of 2 mm which is designated by reference number 32 in FIG. 2. The system serves to image a substantially planar object area 103 in an image region 105 which is likewise substantially planar. FIG. 2 furthermore shows an upper marginal beam 109 and a lower marginal beam 111 of a beam bundle emanating from a central field point 113 as well as an upper marginal beam 115, a main beam 117 and a lower marginal beam 119 of an outermost lower field point 121. It is evident from the path of the marginal beams 109, 111, 115 and 117 that the projection exposure system 101 is a three-bulge system. The 31 lenses or, with the terminal plate 32 being incorporated, 32 optical elements of the system can be divided into five groups. Lenses 1 to 5 define a first lens group $G_1$ which, as a whole, provides a positive refractive power. Lenses 6 to 9 define a lens group $G_2$ which, as a whole, provides a negative refractive power. Lenses 10 to 13 define a third lens group $G_3$ which, as a whole, provides a positive refractive power. Lenses 14 to 16 define a fourth lens group $G_4$ which, as a whole, provides a negative refractive power. Lenses 17 to 31, plus 32, define a fifth lens group $G_5$ which, as a whole, provides a positive refractive power. A system diaphragm 123 is disposed in the region of the fifth lens group $G_5$ where the lower marginal beam 111 of the central field point 113 intersects the lower marginal beam 119 of the lower field point 121.

The following materials are used for the optical elements: the lenses 2, 5, 6, 7, 8, 10, 11, 12, 13, 14, 17, 18, 19, 21, 23, 24, 25, 26, 28, 29, 30 and 31 are made of the FK5 material of the company SCHOTT. The lenses 1, 3 and 22 are made of the LF5 material of SCHOTT. The lenses 4, 9, 15, 16 and 27 are made of the LLF1 material of SCHOTT. The components 20 and 30 are made of quartz glass.

The LF5 and LLF1 materials are allocatable to the group of flint glasses. The FK5 material is allocatable to the group of crown glasses.

The lenses 28, 29 30 and 31 which are close to the image plane 105, that is, in operation, close to the wafer are made of the FK5 material. This material has a refractive index of 1.50393369 and thus of less than 1.55 if this refractive index is determined at a wavelength of 365.5 nm. Moreover, this material has an Abbe number $V_{365.5} \approx 560$ if it is determined according to the formula $$V_{365.5} = \frac{(N_{365.5} - 1)}{N_{362.5} - N_{368.5}}$$

wherein $N_x$ is the refractive index of the material at a wavelength x. The Abbe number of the FK5 material is thus higher than a limit value $V_g$ of, for example, 400.

The FK5 material of SCHOTT belongs to the group of materials referred to in this application as first material group.

The LF5 material has a refractive index of 1.61906768 and an Abbe number of about $V_{365.5} \approx 270$ if it is likewise determined according to the above formula.

The LLF1 material has a refractive index if 1.57916392 and an Abbe number of $V_{365.5} \approx 310$ if it is likewise determined according to the above formula.

The refractive indices of the LF5 and LLF1 glasses are thus higher than 1.54, while the Abbe numbers thereof are smaller than the exemplary limit value of $V_g = 400$.

Of the materials used, the FK5 material exhibits the second best long-term stability against radiation of the wavelength band about 365.5 nm for which the system is predominantly designed. The best stability is exhibited by the components 20 and 32 made of quartz glass.

The material LLF1 exhibits a stability against radiation load which is reduced as compared to FK5, whereas the LF5 material exhibits the lowest long-term stability of all materials. Of the components 1, 3, 4, 9, 15, 16, 22 and 27 made of the second material group, merely lens 22 is made of the LF5 material. This lens, however, is one of the lenses of the system with the largest free diameter, so that, due to the large cross-sectional area, a reduced radiation load occurs. Lens 22 made of the LF5 material with a free diameter of 195.69 mm has a size of 91.9% of the lens 24 which, having a free diameter of 212.87 mm, is the lens having the largest free diameter in the system.

Moreover, lens 22 made of the LF5 material is disposed at a location of the beam path where there is a relatively little displacement of bundle cross-sections of beam bundles emanating from diametrically opposed field points.

This is illustrated in further detail in FIG. 3. In this Figure, D indicates half of the free diameter of lens 22, $r_1$ indicates the radius of the beam bundle which emanates from the lower outermost field point 121 and $r_2$ indicates the radius of a beam bundle which emanates from a further outermost field point 121 disposed diametrically opposed to the lower outermost field point 121 in respect of the optical axis 107.

A distance between bundle centers 131 and 132 of these two beam bundles is designated by q in FIG. 3. In FIG. 3, a ratio of q to 2D is about 20° which does not necessarily corresponds to the real conditions, for example, in lens 22.

In the following, variants of the embodiment described with reference to FIGS. 2 and 3 will be described. Components which correspond in structure and function to components of the embodiment described with reference to FIGS. 2 and 3 are designated by the corresponding reference signs. FIG. 4 illustrates a further projection exposure system 101, the optical data of which are indicated in the following Table 3:

TABLE 3

| Surface | Radii | Thicknesses | Medium | Refractive index | ½ free diameter |
|---|---|---|---|---|---|
| 0 | 0.000000000 | 32.000000000 | L710 | 0.99998200 | 59.000 |
| 1 | 0.000000000 | 5.201908388 | L710 | 0.99998200 | 64.613 |
| 2 | −661.054742744 | 10.597577126 | LLF1HL | 1.57905206 | 64.964 |
| 3 | −244.763741563 | 10.881589768 | HE20 | 0.99976000 | 65.673 |
| 4 | −130.229653149 | 8.000000000 | FK5HL | 1.50391017 | 65.818 |
| 5 | 359.452379850 | 8.145832344 | HE20 | 0.99976000 | 73.729 |
| 6 | 1869.000000000 | 25.889017376 | LF5HL | 1.61902889 | 74.786 |
| 7 | −169.172054615 | 0.600000000 | HE20 | 0.99976000 | 76.510 |
| 8 | 775.360747172 | 15.383724400 | LLF1HL | 1.57905206 | 80.033 |
| 9 | −494.373044356 | 0.600000000 | HE20 | 0.99976000 | 80.300 |
| 10 | 216.147437120 | 32.669070619 | FK5HL | 1.50391017 | 80.192 |
| 11 | −302.103981085 | 0.600000000 | HE20 | 0.99976000 | 79.296 |
| 12 | 192.039294254 | 14.309261863 | FK5HL | 1.50391017 | 70.109 |
| 13 | 112.442556683 | 20.570062640 | HE20 | 0.99976000 | 62.479 |
| 14 | 4969.718406730 | 5.000000000 | FK5HL | 1.50391017 | 61.975 |
| 15 | 130.169698546 | 22.263540496 | HE20 | 0.99976000 | 58.818 |
| 16 | −298.524605304 | 7.171571120 | FK5HL | 1.50391017 | 58.803 |
| 17 | 139.540198572 | 0.760163000 | HE20 | 0.99976000 | 60.492 |
| 18 | 137.246786622 | 11.000000000 | SIO2HL | 1.47449062 | 60.996 |
| 19 | 177.468981757 | 41.134978753 | HE20 | 0.99976000 | 61.523 |
| 20 | −86.795812248 | 6.783726889 | LLF1HL | 1.57905206 | 62.581 |
| 21 | −1084.641004990 | 1.225007423 | HE20 | 0.99976000 | 78.922 |
| 22 | −2819.674356910 | 47.217471701 | FK5HL | 1.50391017 | 81.744 |
| 23 | −113.563780062 | 0.600000112 | HE20 | 0.99976000 | 86.364 |
| 24 | 0.000000000 | 28.724827557 | FK5HL | 1.50391017 | 98.367 |
| 25 | −226.420099890 | 0.600000169 | HE20 | 0.99976000 | 99.467 |
| 26 | 449.900971158 | 23.762201304 | FK5HL | 1.50391017 | 101.252 |
| 27 | −731.539953780 | 0.600000000 | HE20 | 0.99976000 | 101.024 |
| 28 | 206.572700755 | 22.356910583 | FK5HL | 1.50391017 | 96.647 |
| 29 | 715.807052636 | 0.812729044 | HE20 | 0.99976000 | 95.399 |
| 30 | 115.626477487 | 43.663887059 | FK5HL | 1.50391017 | 84.921 |
| 31 | 96.099626638 | 10.611297966 | HE20 | 0.99976000 | 66.739 |
| 32 | 127.905996862 | 10.000000000 | FK5HL | 1.50391017 | 65.999 |
| 33 | 88.119735529 | 37.471785738 | HE20 | 0.99976000 | 59.453 |
| 34 | −161.423801442 | 6.000000000 | LLF1HL | 1.57905206 | 58.614 |
| 35 | 156.517030870 | 30.334748725 | HE20 | 0.99976000 | 58.544 |
| 36 | −118.649853783 | 6.642688287 | LLF1HL | 1.57905206 | 59.312 |
| 37 | 466.706723085 | 12.854093749 | HE20 | 0.99976000 | 69.368 |
| 38 | −463.523475033 | 16.570891307 | FK5HL | 1.50391017 | 71.208 |
| 39 | −174.413396988 | 0.649146799 | HE20 | 0.99976000 | 74.263 |
| 40 | 614.751431159 | 28.470734271 | FK5HL | 1.50391017 | 88.573 |
| 41 | −267.716429052 | 8.900070186 | HE20 | 0.99976000 | 90.466 |
| 42 | 513.314914536 | 38.676154625 | FK5HL | 1.50391017 | 99.799 |
| 43 | −281.490221229 | 2.000000000 | HE20 | 0.99976000 | 100.864 |
| 44 | 0.000000000 | 6.000000000 | SIO2HL | 1.47449062 | 100.153 |
| 45 | 0.000000000 | 16.000000000 | HE20 | 0.99976000 | 100.013 |
| 46 | 0.000000000 | −16.000000000 | HE20 | 0.99976000 | 99.464 |
| 47 | 0.000000000 | 14.000000000 | HE20 | 0.99976000 | 100.013 |
| 48 | 501.198000000 | 32.719926806 | FK5HL | 1.50391017 | 100.430 |
| 49 | −316.233100115 | 3.222987363 | HE20 | 0.99976000 | 100.483 |
| 50 | −293.599499791 | 9.700000000 | LF5HL | 1.61902889 | 100.158 |
| 51 | 219.350000000 | 14.313216090 | HE20 | 0.99976000 | 102.388 |
| 52 | 278.199999792 | 50.848784677 | FK5HL | 1.50391017 | 107.794 |
| 53 | −293.599499920 | 0.600000000 | HE20 | 0.99976000 | 108.890 |
| 54 | 321.720000155 | 31.720910762 | FK5HL | 1.50391017 | 109.046 |
| 55 | −850.070000069 | 0.600000000 | HE20 | 0.99976000 | 108.376 |
| 56 | 128.878000341 | 39.754795339 | FK5HL | 1.50391017 | 95.863 |
| 57 | 481.232000069 | 0.600000000 | HE20 | 0.99976000 | 92.881 |
| 58 | 119.616000000 | 20.200550207 | FK5HL | 1.50391017 | 78.628 |
| 59 | 184.122999990 | 14.243725202 | HE20 | 0.99976000 | 74.005 |
| 60 | 793.959999987 | 12.591473480 | LLF1HL | 1.57905206 | 72.131 |
| 61 | 142.158000423 | 0.600000000 | HE20 | 0.99976000 | 60.052 |
| 62 | 97.579000000 | 18.237940745 | FK5HL | 1.50391017 | 56.849 |
| 63 | 58.110000000 | 11.497956939 | HE20 | 0.99976000 | 44.206 |
| 64 | 91.829000000 | 24.368245501 | SIO2HL | 1.47449062 | 43.385 |
| 65 | 56.848000000 | 0.600000000 | HE20 | 0.99976000 | 32.677 |
| 66 | 45.041000000 | 17.912233519 | SIO2HL | 1.47449062 | 31.580 |
| 67 | 1150.000000000 | 2.360581982 | HE20 | 0.99976000 | 28.796 |
| 68 | 0.000000000 | 3.000000000 | SIO2HL | 1.47449062 | 27.006 |
| 69 | 0.000000000 | 12.000000000 | L710 | 0.99998200 | 25.485 |
| 70 | 0.000000000 | | | | 14.750 |

All of the 32 lenses of the projection exposure system shown in FIG. 4 have spherical surfaces. Lenses 1 to 5 are allocated to a first lens group $G_1$ having a positive refractive power. Lenses 6 to 10 are allocated to a second lens group $G_2$ having a negative refractive power. Lenses 11 to 14 are allocated to a third lens group $G_3$ having, as a whole, a positive refractive power. Lenses 15 to 18 are allocated to a fourth lens group $G_4$ having, as a whole, a negative refractive power. Lenses 19 to 32, plus a terminal plate 33, are allocated to a fifth lens group $G_5$ having, as a whole, a positive refractive power.

The system shown in FIG. 4 is very similar to the system in FIG. 2. However, it differs from the latter in of a partial group 131 of the fifth lens group $G_5$ which is close to the second object 105 and comprises the lenses 30, 31 and 32, two lenses, namely lenses 31 and 32, are made of quartz glass. However, none of the lenses 30, 31, 32 of the lens group 131 disposed close to the wafer is made of materials of the second material group. In the embodiment shown in FIG. 4, too, relatively few components are made of flint glass, here glasses LLF1 and LF5. Lens 24 which is made of the LF5 material, i.e., the material of the two above-mentioned ones which is more susceptible to radiation load, is disposed in the region of a relatively large free beam diameter of the fifth lens group $G_5$.

A further embodiment of the projection exposure system is shown in FIG. 5, the optical data thereof being indicated in Table 4 below:

TABLE 4

| Surface | Radii | Thicknesses | Medium | Refractive index | ½ free diameter |
|---|---|---|---|---|---|
| 0 | 0.000000000 | 32.000000000 | | 1.00000000 | 59.000 |
| 1 | 0.000000000 | 20.661283629 | | 1.00000000 | 64.558 |
| 2 | −111.188782764 | 7.500000000 | SUPRA1 | 1.47447761 | 64.558 |
| 3 | 1044.117026287 | 5.631557530 | | 1.00000000 | 74.836 |
| 4 | −6522.757198827 | 28.462316410 | LF5 | 1.61906768 | 76.297 |
| 5 | −152.064070605 | 0.700000000 | | 1.00000000 | 78.632 |
| 6 | 4174.666996920 | 18.820233303 | LF5 | 1.61906768 | 82.895 |
| 7 | −323.399070672 | 0.700000000 | | 1.00000000 | 83.618 |
| 8 | 276.085518412 | 28.324664425 | FK5 | 1.50393369 | 83.695 |
| 9 | −417.240395857 | 0.700000000 | | 1.00000000 | 82.972 |
| 10 | 197.537123613 | 18.665436059 | SUPRA1 | 1.47447761 | 76.341 |
| 11 | 747.689679031 | 0.700000000 | | 1.00000000 | 74.115 |
| 12 | 117.405251606 | 8.370816389 | LF5 | 1.61906768 | 66.458 |
| 13 | 88.004919252 | 25.692310808 | | 1.00000000 | 60.325 |
| 14 | 2407.809906857 | 7.500000000 | FK5 | 1.50393369 | 59.536 |
| 15 | 112.869324513 | 23.413285790 | | 1.00000000 | 55.037 |
| 16 | −232.219785599 | 7.500000000 | LLF1 | 1.57916392 | 54.911 |
| 17 | 200.734425625 | 29.730361848 | | 1.00000000 | 56.181 |
| 18 | −93.822277301 | 34.992229843 | LF5 | 1.61906768 | 56.880 |
| 19 | 16329.783148621 | 0.700000000 | | 1.00000000 | 81.243 |
| 20 | 1496.565112315 | 41.754230352 | FK5 | 1.50393369 | 83.779 |
| 21 | −133.013546131 | 0.700000000 | | 1.00000000 | 87.012 |
| 22 | −997.788220363 | 25.716111377 | FK5 | 1.50393369 | 95.340 |
| 23 | −213.328508971 | 0.700000000 | | 1.00000000 | 96.909 |
| 24 | 565.024020217 | 22.267630949 | LLF1 | 1.57916392 | 99.826 |
| 25 | −783.111728915 | 0.700000000 | | 1.00000000 | 99.755 |
| 26 | 156.357415717 | 40.532446738 | FK5 | 1.50393369 | 96.086 |
| 27 | −8404.755315777 | 0.700000000 | | 1.00000000 | 93.963 |
| 28 | 162.727735224 | 28.087985964 | FK5 | 1.50393369 | 82.323 |
| 29 | 2433.769683095 | 7.033622247 | | 1.00000000 | 78.656 |
| 30 | −894.969351597 | 9.030606766 | FK5 | 1.50393369 | 76.346 |
| 31 | 91.319408938 | 33.822770472 | | 1.00000000 | 60.343 |
| 32 | −212.432282527 | 7.500000000 | FK5 | 1.50393369 | 59.647 |
| 33 | 124.212404197 | 31.911524352 | | 1.00000000 | 57.418 |
| 34 | −116.574231997 | 27.624156767 | LF5 | 1.61906768 | 57.812 |
| 35 | 569.538912765 | 9.728886180 | | 1.00000000 | 72.438 |
| 36 | −1057.564068923 | 22.838848295 | FK5 | 1.50393369 | 74.166 |
| 37 | −171.030233916 | 0.700000000 | | 1.00000000 | 77.256 |
| 38 | 366.961198433 | 28.192949883 | FK5 | 1.50393369 | 89.665 |
| 39 | −414.260486992 | 0.700000000 | | 1.00000000 | 90.788 |
| 40 | 384.366160426 | 25.455343714 | FK5 | 1.50393369 | 93.663 |
| 41 | −641.891335386 | −2.766111080 | | 1.00000000 | 93.658 |
| 42 | 0.000000000 | 5.636846798 | | 1.00000000 | 93.346 |
| 43 | 431.031845480 | 37.977337508 | FK5 | 1.50393369 | 94.668 |
| 44 | −228.618310317 | 3.199548355 | | 1.00000000 | 94.516 |
| 45 | −218.508619872 | 23.845728106 | LF5 | 1.61906768 | 93.789 |
| 46 | 240.366071551 | 13.230649262 | | 1.00000000 | 95.133 |
| 47 | 522.257860819 | 31.407780366 | FK5 | 1.50393369 | 95.987 |
| 48 | −311.265656291 | 0.700000000 | | 1.00000000 | 97.033 |
| 49 | 246.201672686 | 35.112104162 | FK5 | 1.50393369 | 99.331 |
| 50 | 6270.516480178 | 0.700000000 | | 1.00000000 | 97.755 |
| 51 | 155.310012192 | 46.384312484 | FK5 | 1.50393369 | 93.073 |
| 52 | 477.890701308 | 0.700000000 | | 1.00000000 | 85.347 |
| 53 | 176.712993621 | 27.621391260 | FK5 | 1.50393369 | 80.215 |
| 54 | 266.563889614 | 0.700000000 | | 1.00000000 | 72.023 |
| 55 | 128.812275863 | 58.534298914 | FK5 | 1.50393369 | 66.871 |
| 56 | 387.199528908 | 7.439347123 | | 1.00000000 | 43.077 |

TABLE 4-continued

| Surface | Radii | Thicknesses | Medium | Refractive index | ½ free diameter |
|---|---|---|---|---|---|
| 57 | −329.427177242 | 7.500000000 | FK5 | 1.50393369 | 40.794 |
| 58 | 53.414291554 | 0.700000000 | | 1.00000000 | 31.925 |
| 59 | 47.258242704 | 19.426754985 | FK5 | 1.50393369 | 31.342 |
| 60 | −732.790228385 | 1.488401667 | | 1.00000000 | 28.072 |
| 61 | 0.000000000 | 2.000000000 | SUPRA1 | 1.47447761 | 26.292 |
| 62 | 0.000000000 | 12.001007801 | | 1.00000000 | 25.291 |
| 63 | 0.000000000 | −0.001150594 | | 1.00000000 | 14.750 |

An optical system 101 shown in FIG. 5 comprises 29 lenses, each having spherical lens surfaces, as well as a terminal plate 30. The classification of these lenses into lens groups having a positive refractive power and a negative refractive power is as follows:

Lens 1 to 5 are allocated to a first lens group $G_1$ having a positive refractive power. Lenses 6 to 9 are allocated to a second lens group $G_2$ having a negative refractive power. Lenses 10 to 14 are allocated to a third lens group $G_3$ having, as a whole, a positive refractive power. Lenses 15 to 17 are allocated to a fourth lens group $G_4$ having, as a whole, a negative refractive power. Lenses 18 to 29, plus a terminal plate 30, are allocated to a fifth lens group $G_5$ having, as a whole, a positive refractive power.

The fifth lens group $G_5$ merely comprises a single lens (number 22) which is made of a material of the second material group. This is the LF5 material. This lens is again disposed in a region where a displacement of the bundle cross-sections of beams which emanate from diametrically opposed outermost field points is very small and has a value of less than 10% of the free diameter of this lens. A partial group 131 consisting of lenses 23 to 29 of lenses of the fifth lens group $G_5$ is made of the FK5 material. These are the lenses which are close to the second object or wafer and are subjected to an extremely high load both as regards radiation density and radiation deflection. These lenses are thus made of a material of the first material group which is particularly radiation-resistant.

An embodiment of a projection exposure system 101 shown in FIG. 6 comprises 32 optical components (the optical data thereof are indicated in Table 5 below). Their classification in groups $G_1$ to $G_5$ can be effected as follows:

Lenses 1 to 5 are allocated to a first lens group $G_1$ having a positive refractive power. Lenses 6 to 10 are allocated to a second lens group $G_2$ having a negative refractive power. Lenses 11 to 15 are allocated to a third lens group $G_3$ having, as a whole, a positive refractive power. Lenses 16 to 18 are allocated to a fourth lens group $G_4$ having, as a whole, a negative refractive power. Lenses 19 to 31, plus lens 32, are allocated to a fifth lens group $G_5$ having, as a a positive refractive power.

TABLE 5

| Surface | Radii | Thicknesses | Medium | Refractive index | ½ free diameter |
|---|---|---|---|---|---|
| 0 | 0.000000000 | 32.000000000 | L710 | 0.99998200 | 59.000 |
| 1 | 0.000000000 | 9.444238199 | L710 | 0.99998200 | 64.535 |
| 2 | −311.927851990 | 11.089934901 | FK5 | 1.50393369 | 64.984 |
| 3 | −181.428152021 | 10.400892620 | HE20 | 0.99976000 | 66.009 |
| 4 | −118.524477504 | 8.000000000 | FK5 | 1.50393369 | 66.236 |
| 5 | 401.250423152 | 9.147444865 | HE20 | 0.99976000 | 75.864 |
| 6 | 4344.106783837 | 27.681393443 | LF5 | 1.61906768 | 77.396 |
| 7 | −156.541320233 | 0.700000000 | HE20 | 0.99976000 | 79.163 |
| 8 | 389.649615896 | 20.306038892 | FK5 | 1.50393369 | 84.577 |
| 9 | −654.208379945 | 0.700000000 | HE20 | 0.99976000 | 84.776 |
| 10 | 287.218885965 | 31.151432162 | FK5 | 1.50393369 | 84.559 |
| 11 | −279.199609529 | 0.700000000 | HE20 | 0.99976000 | 83.956 |
| 12 | 158.523597789 | 20.996036629 | FK5 | 1.50393369 | 72.692 |
| 13 | 103.787825100 | 26.116106158 | HE20 | 0.99976000 | 62.671 |
| 14 | −782.918785418 | 7.000000000 | FK5 | 1.50393369 | 61.997 |
| 15 | 131.910015514 | 21.785618927 | HE20 | 0.99976000 | 58.731 |
| 16 | −323.683912563 | 7.000000000 | FK5 | 1.50393369 | 58.821 |
| 17 | 162.083641806 | 0.700000000 | HE20 | 0.99976000 | 60.874 |
| 18 | 154.584107186 | 7.704332741 | FK5 | 1.50393369 | 61.477 |
| 19 | 186.827774796 | 40.187765501 | HE20 | 0.99976000 | 61.882 |
| 20 | −86.225264321 | 7.000000000 | LLF1 | 1.57916392 | 62.707 |
| 21 | −705.417764820 | 4.794429538 | HE20 | 0.99976000 | 78.952 |
| 22 | −1040.227609005 | 43.042787088 | FK5 | 1.50393369 | 84.413 |
| 23 | −113.882639114 | 0.700000000 | HE20 | 0.99976000 | 87.484 |
| 24 | −1501.300440742 | 24.953541861 | FK5 | 1.50393369 | 99.619 |
| 25 | −234.915280384 | 0.700000000 | HE20 | 0.99976000 | 100.878 |
| 26 | 510.926182463 | 26.022851665 | FK5 | 1.50393369 | 104.709 |
| 27 | −571.417608701 | 0.700000000 | HE20 | 0.99976000 | 104.724 |
| 28 | 218.131483276 | 26.671165595 | FK5 | 1.50393369 | 101.497 |
| 29 | 1296.198010698 | 0.700000000 | HE20 | 0.99976000 | 100.230 |
| 30 | 120.687132319 | 56.529600371 | FK5 | 1.50393369 | 88.992 |
| 31 | 90.620870733 | 11.750561859 | HE20 | 0.99976000 | 65.101 |

TABLE 5-continued

| Surface | Radii | Thicknesses | Medium | Refractive index | ½ free diameter |
|---|---|---|---|---|---|
| 32 | 121.167835192 | 7.000000000 | FK5 | 1.50393369 | 64.239 |
| 33 | 90.915840804 | 35.617083391 | HE20 | 0.99976000 | 59.635 |
| 34 | −167.750316271 | 7.000000000 | LLF1 | 1.57916392 | 59.022 |
| 35 | 150.866221845 | 31.250738202 | HE20 | 0.99976000 | 58.993 |
| 36 | −115.391399204 | 7.000000000 | LLF1 | 1.57916392 | 59.691 |
| 37 | 532.903096962 | 9.549410572 | HE20 | 0.99976000 | 70.580 |
| 38 | −1179.176098456 | 22.240519284 | FK5 | 1.50393369 | 72.887 |
| 39 | −165.888015525 | 0.700000000 | HE20 | 0.99976000 | 76.057 |
| 40 | 397.885948905 | 32.827416184 | FK5 | 1.50393369 | 91.934 |
| 41 | −270.366549631 | 5.911356416 | HE20 | 0.99976000 | 93.170 |
| 42 | 618.783704027 | 26.820604247 | FK5 | 1.50393369 | 97.881 |
| 43 | −362.711535921 | 1.700000000 | HE20 | 0.99976000 | 98.142 |
| 44 | 0.000000000 | 6.000000000 | SUPRA1 | 1.47447761 | 97.065 |
| 45 | 0.000000000 | 16.000000000 | HE20 | 0.99976000 | 96.777 |
| 46 | 0.000000000 | −16.000000000 | HE20 | 0.99976000 | 95.647 |
| 47 | 0.000000000 | 9.000000000 | HE20 | 0.99976000 | 96.777 |
| 48 | 336.329780290 | 37.325480941 | FK5 | 1.50393369 | 96.261 |
| 49 | −284.881632662 | 7.861225022 | HE20 | 0.99976000 | 95.975 |
| 50 | −244.589205122 | 10.000000000 | LF5 | 1.61906768 | 94.506 |
| 51 | 193.491898200 | 11.805473540 | HE20 | 0.99976000 | 95.053 |
| 52 | 235.940524490 | 46.343334587 | FK5 | 1.50393369 | 99.014 |
| 53 | −271.608864830 | 0.700000000 | HE20 | 0.99976000 | 99.562 |
| 54 | 383.703940087 | 21.747494278 | FK5 | 1.50393369 | 97.901 |
| 55 | −1334.216744204 | 0.700000000 | HE20 | 0.99976000 | 97.232 |
| 56 | 119.914859771 | 35.236397604 | FK5 | 1.50393369 | 87.691 |
| 57 | 430.327205454 | 0.700000000 | HE20 | 0.99976000 | 85.077 |
| 58 | 112.713649998 | 22.770868262 | FK5 | 1.50393369 | 73.087 |
| 59 | 191.347588922 | 12.870171550 | HE20 | 0.99976000 | 67.414 |
| 60 | 1059.409420929 | 30.749249456 | FK5 | 1.50393369 | 65.040 |
| 61 | 55.209590077 | 8.161805322 | HE20 | 0.99976000 | 40.284 |
| 62 | 71.322184756 | 17.306203742 | SUPRA1 | 1.47447761 | 39.436 |
| 63 | 57.924369902 | 0.700000000 | HE20 | 0.99976000 | 32.783 |
| 64 | 45.290125679 | 18.322003097 | SUPRA1 | 1.47447761 | 31.685 |
| 65 | 3911.657028771 | 2.706991290 | HE20 | 0.99976000 | 28.931 |
| 66 | 0.000000000 | 3.000000000 | SUPRA1 | 1.47447761 | 26.670 |
| 67 | 0.000000000 | 12.000000000 | L710 | 0.99998200 | 25.180 |
| 68 | 0.000000000 | 0.000000000 | | | 14.750 |

A partial group 131 consisting of lenses 25 to 32 and being disposed closest to the object or wafer is made of the FK5 material. Merely one lens of the lens group G₅, namely lens 24, is made of a material of the second material group, y the LF5 material. This is again a lens having a very free diameter.

A third lens group G₃ is completely free of materials of the second material group.

The first bulge, that is, the first lens group G₁ and the first waist, that is, the second lens group G₂, merely comprise a single lens which is made of a material of the Merely the second material group, namely LF5 and LLF1, respectively. Merely the second waist corresponding to the fourth lens group comprises two lenses which are made of the LLF1 material of the second material group. Accordingly, the system 101 includes a particularly small volume proportion of materials of the second material group.

Moreover, the lenses 30 and 31 which are disposed closest wafer are made of quartz glass.

A further embodiment of a projection exposure system 101 is shown in FIG. 7, the optical data of which are indicated in Table 6 below:

TABLE 6

| Surface | Radii | Thicknesses | Medium | Refractive index | ½ free diameter |
|---|---|---|---|---|---|
| 0 | 0.000000000 | 32.000000000 | L710 | 0.99998200 | 54.410 |
| 1 | 0.000000000 | 6.509726858 | L710 | 0.99998200 | 59.909 |
| 2 | −345.837608233 | 20.937634434 | FK5 | 1.50393369 | 60.123 |
| 3 | −138.710240702 | 4.139495305 | HE22 | 0.99975600 | 62.120 |
| 4 | −117.590857172 | 7.000000000 | FK5 | 1.50393369 | 62.137 |
| 5 | −231.054862836 | 0.700000000 | HE22 | 0.99975600 | 65.357 |
| 6 | −579.679241805 | 28.686881101 | FK5 | 1.50393369 | 66.421 |
| 7 | −137.166922545 | 0.700000000 | HE22 | 0.99975600 | 68.551 |
| 8 | 120.364915645 | 24.197329481 | FK5 | 1.50393369 | 66.273 |
| 9 | 1050.735539941 | 0.700000000 | HE22 | 0.99975600 | 64.707 |
| 10 | 199.473249572 | 7.000000000 | FK5 | 1.50393369 | 61.726 |
| 11 | 100.241943039 | 11.872055781 | HE22 | 0.99975600 | 56.673 |
| 12 | 220.743162395 | 7.000000000 | FK5 | 1.50393369 | 56.366 |
| 13 | 109.954107613 | 20.291682547 | HE22 | 0.99975600 | 53.471 |
| 14 | −366.690835026 | 7.000000000 | FK5 | 1.50393369 | 53.342 |

TABLE 6-continued

| | | | | |
|---|---|---|---|---|
| 15 | 168.903118236 | 22.511779576 HE22 | 0.99975600 | 53.644 |
| 16 | −139.218031623 | 8.985080714 FK5 | 1.50393369 | 54.208 |
| 17 | −123.567400000 | 2.500000000 HE22 | 0.99975600 | 56.004 |
| 18 | −128.783147634 | 13.174515048 FK5 | 1.50393369 | 56.475 |
| 19 | 277.363638285 | 16.146941688 HE22 | 0.99975600 | 65.608 |
| 20 | −374.603552926 | 11.576860915 SIO2HL | 1.47449062 | 67.030 |
| 21 | −343.089730000AS | 0.711044489 HE22 | 0.99975600 | 71.729 |
| 22 | −420.199838469 | 18.542914675 FK5 | 1.50393369 | 72.916 |
| 23 | −155.539539836 | 17.496701961 HE22 | 0.99975600 | 75.336 |
| 24 | 1333.809093290 | 36.124714972 FK5 | 1.50393369 | 91.010 |
| 25 | −185.832172282 | 0.700000000 HE22 | 0.99975600 | 92.832 |
| 26 | 250.721900038 | 41.103381343 FK5 | 1.50393369 | 95.351 |
| 27 | −332.445610329 | 0.700000000 HE22 | 0.99975600 | 94.503 |
| 28 | 116.444713685 | 47.036743919 FK5 | 1.50393369 | 79.545 |
| 29 | 111.619277578 | 16.476537641 HE22 | 0.99975600 | 62.131 |
| 30 | 447.447071546 | 7.025570125 LLF1 | 1.57916392 | 61.355 |
| 31 | 129.972246168 | 6.762847605 HE22 | 0.99975600 | 56.413 |
| 32 | 209.060715792 | 6.000000000 LLF1 | 1.57916392 | 56.067 |
| 33 | 142.896213121 | 23.909037803 HE22 | 0.99975600 | 53.895 |
| 34 | −143.341221627 | 6.000000000 LLF1 | 1.57916392 | 53.429 |
| 35 | 229.232144802 | 26.400382259 HE22 | 0.99975600 | 54.656 |
| 36 | −102.036060134 | 6.945363072 LLF1 | 1.57916392 | 55.469 |
| 37 | 657.537737065 | 12.681324161 HE22 | 0.99975600 | 65.553 |
| 38 | −530.143894386 | 27.703305073 FK5 | 1.50393369 | 69.472 |
| 39 | −159.801566428 | 0.700000000 HE22 | 0.99975600 | 76.285 |
| 40 | 765.615799963 | 32.449421705 FK5 | 1.50393369 | 89.488 |
| 41 | −230.219500740 | 25.661035204 HE22 | 0.99975600 | 91.709 |
| 42 | −2006.326386923 | 23.268749957 FK5 | 1.50393369 | 100.085 |
| 43 | −281.880872075 | 7.000000000 HE22 | 0.99975600 | 101.130 |
| 44 | 0.000000000 | 0.000000000 HE22 | 0.99975600 | 103.328 |
| 45 | 812.988201022 | 25.496187393 FK5 | 1.50393369 | 106.335 |
| 46 | −483.887830132 | 0.700000000 HE22 | 0.99975600 | 106.775 |
| 47 | 409.386219611 | 30.113836534 FK5 | 1.50393369 | 106.429 |
| 48 | −620.224929129 | 13.212599489 HE22 | 0.99975600 | 105.746 |
| 49 | −277.990919522 | 10.000000000 LLF1 | 1.57916392 | 105.366 |
| 50 | 264.328541579 | 10.759380926 HE22 | 0.99975600 | 105.744 |
| 51 | 259.384813207 | 56.002902356 FK5 | 1.50393369 | 109.552 |
| 52 | −293.158581481 | 0.700000000 HE22 | 0.99975600 | 109.747 |
| 53 | 187.834974740 | 29.248655554 FK5 | 1.50393369 | 100.299 |
| 54 | 817.293359840 | 0.700000000 HE22 | 0.99975600 | 98.298 |
| 55 | 147.554780891 | 37.816848863 FK5 | 1.50393369 | 87.855 |
| 56 | −1882.512255332 | 4.274618665 HE22 | 0.99975600 | 84.162 |
| 57 | −689.155322670 | 8.806734917 LLF1 | 1.57916392 | 82.907 |
| 58 | 94.754605161 | 0.700000000 HE22 | 0.99975600 | 65.311 |
| 59 | 91.187562936 | 50.682577356 SIO2HL | 1.47449062 | 64.971 |
| 60 | 130.370092405 | 0.700941997 HE22 | 0.99975600 | 50.836 |
| 61 | 82.829181894 | 56.332404098 SIO2HL | 1.47449062 | 48.357 |
| 62 | 1067.571768894 | 1.722932437 HE22 | 0.99975600 | 27.548 |
| 63 | 0.000000000 | 5.000000000 SIO2HL | 1.47449062 | 26.373 |
| 64 | 0.000000000 | 12.000000000 L710 | 0.99998200 | 23.910 |
| 65 | 0.000000000 | 0.000320000 L710 | 0.99998200 | 13.603 |
| 66 | 0.000000000 | 0.000000000 L710 | 0.99998200 | 13.603 |

ASPHERICAL CONSTANTS
SURFACE NO. 21

| | |
|---|---|
| K | 10.1373 |
| C1 | 4.01395910e−008 |
| C2 | 1.18134520e−013 |
| C3 | 4.52594060e−017 |
| C4 | −2.95946970e−021 |
| C5 | 1.11740260e−024 |
| C6 | −6.29238120e−029 |

An aspherical surface which is marked in the tables in the second column, in addition, by the abbreviation "AS" is described by the asphere formula:

$$p(h) = \frac{\frac{h^2}{r}}{1 + \sqrt{1 - (1+K)\frac{h^2}{r^2}}} + C1 \cdot h^4 + C2 \cdot h^6 + \ldots$$

wherein
r is a radius in the vertex of the asphere
h is a distance of a surface point from the optical axis,
p(h) is a arrow height, that is, the distance from a planar surface traversing the surface vertex and is oriented perpendicularly to the optical axis,
K is a conical constant and
C1 . . . C6 are aspherical constants.

Except for the lens surface 21 of lens 10 disposed towards the second object 105, all lens surfaces are spherical lens surfaces. The classification of this three-bulge system into the five lens groups is as follows:

Lenses 1 to 4 are allocated to a first lens group $G_1$ having a positive refractive power. Lenses 5 to 9 are allocated to a second lens group $G_2$ having a negative refractive power. Lenses 10 to 14 are allocated to a third lens group $G_3$ having, as a whole, a positive refractive power. Lenses 15 to 18 are allocated to a fourth lens group $G_4$ having, as a whole, a negative refractive power. Lenses 19 to 30, plus lens 31, are allocated to a fifth lens group $G_5$ having, as a whole, a positive refractive power.

Merely lenses 15, 16, 17, 18, 24 and 28 are made of materials of the second material group. All of these lenses are made of the LLF1 material. Accordingly, this objective comprises no lens at all which is made of the LF5 material which, of the materials of the second material group, namely LLF1 and LF5, is more sensitive to radiation.

The fifth lens group $G_5$ merely includes two lenses of flint glass, namely lens 24 having an almost maximal free diameter and lens 28. Even this lens 28 still has a relatively large free diameter which is 0.765 times the largest free diameter of lens 25.

The terminal plate 31 is made of quartz glass and has a thickness of 5 mm and can thus contribute to a considerable extent to the correction of an image field curvature. Lenses 29 and 30 contiguous to this plane-parallel plate 31 are particularly thick lenses of quartz glass. Lens 29 has a ratio of thickness to free diameter of 0.388. For lens 30 this ratio is 0.579. Of the first to fourth lens groups, merely the fourth group $G_4$ comprises lenses made of the LLF1 material, that is, a material of the second material group. The lens groups $G_1$, $G_2$ and $G_3$ are completely free of lenses made of the second material group.

This particularly refined design is also enabled, among others, due to the fact that one lens, namely lens 10, has an aspherical surface. This aspherical surface enables corrections which, on the other hand, allow to reduce the lens volume of materials of the second material group. Here, lens 10 is the marginal lens of the third lens group $G_3$ which delimits this lens group $G_3$ from the lens group $G_2$. In the region of lens 10 the beam path turns from the first waist into the second bulge and, as is evident from FIG. 7, in particular, the curvature of the lower marginal beam 119 of the lower outermost field point 121 exhibits a curvature deflection point.

An objective 101 shown in FIG. 8 exhibits the optical data indicated in Table 7 below:

TABLE 7

| Surface | Radii | Thicknesses | Medium | Refractive index | ½ free diameter |
|---|---|---|---|---|---|
| 0 | 0.000000000 | 32.000000000 | L710 | 0.99998200 | 54.410 |
| 1 | 0.000000000 | 0.750000000 | L710 | 0.99998200 | 61.227 |
| 2 | 257.086302851AS | 27.456447389 | FK5 | 1.50393369 | 62.787 |
| 3 | −209.777767013 | 5.733033666 | L710 | 0.99998200 | 63.759 |
| 4 | 2246.853389192 | 23.793787473 | FK5 | 1.50393369 | 63.327 |
| 5 | −138.529935896 | 11.758456054 | L710 | 0.99998200 | 63.121 |
| 6 | −146.562707269AS | 7.000000000 | FK5 | 1.50393369 | 56.832 |
| 7 | 150.198866750 | 19.695432873 | L710 | 0.99998200 | 53.218 |
| 8 | −161.550278545 | 7.000000000 | FK5 | 1.50393369 | 53.193 |
| 9 | 230.213267801 | 21.668229260 | L710 | 0.99998200 | 55.439 |
| 10 | −135.020922361 | 7.000000000 | FK5 | 1.50393369 | 56.210 |
| 11 | 275.793524158 | 31.866782379 | L710 | 0.99998200 | 65.618 |
| 12 | −720.783416016 | 21.068987402 | FK5 | 1.50393369 | 82.294 |
| 13 | −197.724036374 | 0.750000000 | L710 | 0.99998200 | 85.699 |
| 14 | −2932.235141013 | 32.346252327 | FK5 | 1.50393369 | 96.526 |
| 15 | −202.687476756 | 0.750000000 | L710 | 0.99998200 | 99.423 |
| 16 | 556.989011171 | 44.824840928 | FK5 | 1.50393369 | 109.885 |
| 17 | −261.299354979 | 0.750000000 | L710 | 0.99998200 | 110.868 |
| 18 | 168.067932476 | 43.818178326 | FK5 | 1.50393369 | 106.214 |
| 19 | 2212.229044278 | 0.750000000 | L710 | 0.99998200 | 103.671 |
| 20 | 154.602221691 | 27.974537641 | FK5 | 1.50393369 | 91.097 |
| 21 | 511.109614775AS | 1.427020587 | L710 | 0.99998200 | 87.028 |
| 22 | 203.750042471 | 10.957454904 | FK5 | 1.50393369 | 80.716 |
| 23 | 97.637022780 | 27.072757658 | L710 | 0.99998200 | 67.572 |
| 24 | 912.104284745 | 7.000000000 | LLF1 | 1.57916392 | 66.476 |
| 25 | 129.851178911 | 29.850899965 | L710 | 0.99998200 | 60.422 |
| 26 | −157.865355431 | 7.000000000 | LLF1 | 1.57916392 | 59.802 |
| 27 | 310.030976716 | 30.535116324 | L710 | 0.99998200 | 60.628 |
| 28 | −97.189133534 | 16.225403180 | LLF1 | 1.57916392 | 61.134 |
| 29 | 978.355427585 | 11.131382680 | L710 | 0.99998200 | 76.843 |
| 30 | −465.646326964 | 32.696102030 | FK5 | 1.50393369 | 78.047 |
| 31 | −175.840701401 | 1.107688422 | L710 | 0.99998200 | 86.842 |
| 32 | −1255.602600202 | 30.875369801 | FK5 | 1.50393369 | 97.446 |
| 33 | −206.718714998 | 0.750000000 | L710 | 0.99998200 | 100.506 |
| 34 | 625.328941866 | 55.961745005 | FK5 | 1.50393369 | 110.152 |
| 35 | −195.406107120 | 4.758523121 | L710 | 0.99998200 | 111.367 |
| 36 | −179.946479842 | 12.000000000 | LF5 | 1.61906768 | 111.129 |
| 37 | −326.560052532 | 6.600000000 | L710 | 0.99998200 | 116.310 |
| 38 | 0.000000000 | 1.000000000 | L710 | 0.99998200 | 117.931 |
| 39 | 880.277431480 | 37.591715990 | FK5 | 1.50393369 | 119.769 |
| 40 | −386.537563150 | 0.750000000 | L710 | 0.99998200 | 120.610 |
| 41 | −387.452099603 | 12.000000000 | LF5 | 1.61906768 | 120.578 |
| 42 | −486.582839626 | 0.750000000 | L710 | 0.99998200 | 122.142 |
| 43 | 338.819180262 | 55.758188246 | FK5 | 1.50393369 | 122.238 |
| 44 | −353.677034290 | 0.942122740 | L710 | 0.99998200 | 120.766 |
| 45 | −351.560711397 | 12.000000000 | LF5 | 1.61906768 | 120.353 |
| 46 | −2553.305133800 | 0.750000000 | L710 | 0.99998200 | 117.638 |

TABLE 7-continued

| | | | | |
|---|---|---|---|---|
| 47 | 278.431299377 | 9.999998390 LF5 | 1.61906768 | 112.851 |
| 48 | 141.274492122 | 1.449051032 L710 | 0.99998200 | 104.112 |
| 49 | 142.560885188 | 56.685027449 FK5 | 1.50393369 | 104.345 |
| 50 | 4205.079723653 | 0.750000000 L710 | 0.99998200 | 101.627 |
| 51 | 125.239909170 | 24.638559390 FK5 | 1.50393369 | 89.597 |
| 52 | 211.511418953 | 0.750000000 L710 | 0.99998200 | 86.719 |
| 53 | 129.722868649 | 31.499453310 FK5 | 1.50393369 | 80.852 |
| 54 | 933.062064234 | 4.174005465 L710 | 0.99998200 | 76.791 |
| 55 | 0.000000000 | 40.807448591 FK5 | 1.50393369 | 75.626 |
| 56 | 0.000000000 | 3.000000000 L710 | 0.99998200 | 51.890 |
| 57 | 0.000000000 | 40.000000000 FK5 | 1.50393369 | 48.423 |
| 58 | 0.000000000 | 10.000000000 L710 | 0.99998200 | 25.157 |
| 59 | 0.000000000 | L710 | 0.99998200 | 13.602 |

ASPHERICAL CONSTANTS
SURFACE NO. 2

| | |
|---|---|
| K | 0.0000 |
| C1 | −1.56147159e−008 |
| C2 | −1.52606461e−011 |
| C3 | −2.08874252e−016 |
| C4 | −3.92787668e−020 |
| C5 | 1.72279373e−023 |
| C6 | −5.82399558e−028 |

ASPHERICAL CONSTANTS
SURFACE NO. 6

| | |
|---|---|
| K | 0.0000 |
| C1 | 2.20837511e−007 |
| C2 | 1.12020181e−011 |
| C3 | 1.81576327e−016 |
| C4 | 1.17156759e−019 |
| C5 | −6.17971012e−024 |
| C6 | −9.86320452e−028 |

ASPHERICAL CONSTANTS
SURFACE NO. 21

| | |
|---|---|
| K | 0.0000 |
| C1 | 3.89758560e−008 |
| C2 | −1.18276360e−012 |
| C3 | 6.47133946e−017 |
| C4 | −5.50034606e−021 |
| C5 | 3.40396458e−025 |
| C6 | −1.66626084e−029 |

Except for the lens surfaces 2 and 6 of the lenses 1 and 3, respectively, disposed towards the first object 103 and the lens surface 21 of lens 10 disposed towards the second object 105, all surfaces are spherical surfaces.

The classification of this three-bulge system into the five groups is as follows:

Lenses 1 to 2 are allocated to a first lens group $G_1$ having a positive refractive power. Lenses 3 to 5 are allocated to a second lens group $G_2$ having a negative refractive power. Lenses 6 to 10 are allocated to a third lens group $G_3$ having, as a whole, a positive refractive power. Lenses 11 to 15 are allocated to a fourth lens group $G_4$ having, as a whole, a negative refractive power. Lenses 16 to 28 are allocated to a fifth lens group $G_5$ having, as a whole, a positive refractive power.

Here, a partial group 131 consisting of the five lenses with numbers 24 to 28 is made of the FK5 material. Accordingly, the five lenses disposed closest to the second object 105 or wafer are not made of the material of the second material group which has a relatively higher sensitivity to radiation. The first lens, viewed from the wafer, which is made of the LF5 material, a material of the second material group, is lens 23. This lens has already a nearly maximum free diameter, namely 92.3% of the free diameter of the largest lens number 20. Moreover, lenses 22 and 19 of the fifth lens group $G_5$ are made of the LF5 material, said lenses 19 and 22 having free diameters which are about as large as that of lens 23. Accordingly, all lenses of the fifth lens group which are made of the second material group are very large lenses and thus subjected to a relatively low radiation density. Moreover, these lenses are also transilluminated particularly uniformly because in the cross-section thereof the beam bundles which emanate from the diametrically opposed outermost field points have a little displacement q of maximally 3% of the bundle diameter (see FIG. 3).

Besides the fifth lens group $G_5$, merely the fourth lens group $G_4$, that is, the second beam waist, comprises lenses made of materials of the second material group. The lens groups $G_1$, $G_2$ and $G_3$ are completely free of the materials of the second material group. All lenses of these lens groups $G_1$, $G_2$ and $G_3$ are made of the FK5 material.

This very advantageous configuration of the system 101 is enabled, among others, due to the fact that by the lenses of groups $G_1$, $G_2$ and $G_3$ a small number of aspherical surfaces is provided. The lenses 1, 3 and 10 each have one aspherical surface. Here, lenses 3 and 10 are each marginal lenses of their lens groups $G_2$ and $G_3$, respectively, wherein lens 3 is the marginal lens of the second lens group $G_2$ disposed towards the lens group $G_1$, and lens 10 is the marginal lens of the lens group $G_3$ disposed towards the lens group $G_4$. Moreover, the surfaces of the marginal lenses (numbers 3, 10) disposed away from the respective lens groups $G_2$ and $G_3$ are aspherical surfaces. Accordingly, these are the surfaces of the marginal lenses where a deflection point can most likely be allocated to the beam path. In these regions of the objective, the possibility to correct optical errors, e.g., chromatic errors is particularly high and thus the effect of aspherical surfaces is particularly strong.

The configuration which is particularly favorable as regards the stability of the optical properties provided by the system 101 is, among others, achieved in that the third bulge of the beam path, that is, the fifth lens group $G_5$, comprises three pseudo-cemented lens pairs. These are the lens pairs formed of lenses 18 and 19, 21 and 22, and 23 and 24, respectively. One lens of each of these lens pairs, namely lenses 18, 21 and 24 are made of the FK5 material and have a positive refractive power, whereas the respective other lenses of the lens pair, namely lenses 19, 22 and 23 are made of the LF5 material and have a negative refractive power. Moreover, the lens surfaces disposed towards each other of these pairs have radii of curvature which deviate only slightly from each other, and the distances of these lens surfaces disposed towards each other are relatively small. In particular, in the pseudo-cemented lens pairs, the lenses having a negative refractive power (19, 22 and 23) are convex-concave lenses.

Moreover, the pseudo-cemented lens pair 18, 19 is disposed in the beam path on the left side of a system diaphragm 123, that is, closer to the first object. The lens surfaces disposed towards each other of this pseudo-cemented lens pair both have a center of curvature which, in regard to the lens pair, is disposed closer to the first object. This means that these two lens surfaces are bulged towards the second object. Vice versa, the surfaces 48, 49 of the pseudo-cemented lens pair formed of lenses 23 and 24 are bulged towards the first object, that is, towards the mask. Accordingly, the centers of curvature thereof are, in regard to the lenses, disposed on the side of the second object.

The lenses (28 and 27) disposed closest to the second object are each provided as plane-parallel plates. The thicknesses thereof are relatively large. For lens 28 a ratio of thickness to free diameter is 0.413 and for lens 27 0.291.

A further embodiment of the projection exposure system 101 is shown in FIG. 9 and has the optical data indicated in Table 8 below:

TABLE 8

| Surface | Radii | Thicknesses | Medium | Refractive index | ½ free diameter |
|---|---|---|---|---|---|
| 0 | 0.000000000 | 32.000000000 | L710 | 0.99998200 | 58.140 |
| 1 | 0.000000000 | 0.750000000 | L710 | 0.99998200 | 65.189 |
| 2 | 282.192219894AS | 27.457052176 | FK5 | 1.50393369 | 66.895 |
| 3 | −241.381215170 | 1.136949390 | L710 | 0.99998200 | 67.889 |
| 4 | 405.519556468 | 28.572155428 | FK5 | 1.50393369 | 67.776 |
| 5 | −162.327564008 | 8.858286438 | L710 | 0.99998200 | 67.270 |
| 6 | −179.515682000AS | 7.000000000 | FK5 | 1.50393369 | 61.430 |
| 87 | 118.671268436 | 26.564134389 | L710 | 0.99998200 | 56.194 |
| 8 | −134.683121024 | 7.000000000 | FK5 | 1.50393369 | 56.193 |
| 9 | 148.266383499 | 28.702061130 | L710 | 0.99998200 | 60.848 |
| 10 | −174.097992291 | 7.000000000 | FK5 | 1.50393369 | 63.018 |
| 11 | 485.623450869AS | 14.345038406 | L710 | 0.99998200 | 74.336 |
| 12 | −687.547260677 | 23.501456012 | FK5 | 1.50393369 | 80.224 |
| 13 | −174.368626089 | 0.750000000 | L710 | 0.99998200 | 84.135 |
| 14 | 5893.679253667 | 36.091386395 | FK5 | 1.50393369 | 98.532 |
| 15 | −205.521224318 | 0.750000000 | L710 | 0.99998200 | 101.609 |
| 16 | 568.218064064 | 38.110079014 | FK5 | 1.50393369 | 112.198 |
| 17 | −354.923718901 | 0.750000000 | L710 | 0.99998200 | 113.078 |
| 18 | 280.594221879 | 37.712148355 | FK5 | 1.50393369 | 112.631 |
| 19 | −1057.381915182 | 0.750000000 | L710 | 0.99998200 | 111.391 |
| 20 | 147.033621246 | 46.010425948 | FK5 | 1.50393369 | 98.437 |
| 21 | −11345.940350233AS | 0.750000000 | L710 | 0.99998200 | 93.635 |
| 22 | 200.357918671 | 12.478706933 | FK5 | 1.50393369 | 81.665 |
| 23 | 97.768502374 | 33.133326081 | L710 | 0.99998200 | 67.606 |
| 24 | −701.580361435 | 7.000000000 | LLF1 | 1.57916392 | 66.184 |
| 25 | 144.978610318 | 26.147037190 | L710 | 0.99998200 | 60.339 |
| 26 | −181.559790041 | 7.000000000 | LLF1 | 1.57916392 | 59.950 |
| 27 | 266.979189364 | 30.790963476 | L710 | 0.99998200 | 61.002 |
| 28 | −101.856287378 | 7.000000000 | LLF1 | 1.57916392 | 61.636 |
| 29 | −762.628295888 | 3.854117064 | L710 | 0.99998200 | 71.317 |
| 30 | −416.729125431 | 7.000000000 | FK5 | 1.50393369 | 71.899 |
| 31 | 574.980608014 | 8.088102241 | L710 | 0.99998200 | 80.369 |
| 32 | −3312.164163035 | 34.055164886 | FK5 | 1.50393369 | 81.811 |
| 33 | −160.925893173 | 0.750000000 | L710 | 0.99998200 | 87.034 |
| 34 | −2523.893889452 | 29.749231922 | FK5 | 1.50393369 | 99.345 |
| 35 | −236.956196188 | 0.750000000 | L710 | 0.99998200 | 102.171 |
| 36 | 1275.048030565 | 48.695032094 | FK5 | 1.50393369 | 109.632 |
| 37 | −201.292310046 | 0.750000000 | L710 | 0.99998200 | 111.098 |
| 38 | −212.255993970 | 12.000000000 | LF5 | 1.61906768 | 110.727 |
| 39 | −415.796881796 | 12.600000000 | L710 | 0.99998200 | 114.933 |
| 40 | 0.000000000 | −5.000000000 | L710 | 0.99998200 | 117.130 |
| 41 | 600.920761675 | 32.924992407 | FK5 | 1.50393369 | 118.714 |
| 42 | −631.513980140 | 0.750000000 | L710 | 0.99998200 | 119.491 |

TABLE 8-continued

| | | | | | |
|---|---|---|---|---|---|
| 43 | 336.754523305 | 56.047480672 | FK5 | 1.50393369 | 120.323 |
| 44 | −333.201559280 | 0.750000000 | L710 | 0.99998200 | 119.014 |
| 45 | −338.496328889 | 12.000000000 | LF5 | 1.61906768 | 118.464 |
| 46 | 2065.431059856 | 0.750000000 | L710 | 0.99998200 | 115.611 |
| 47 | 442.741290839 | 10.000000000 | LF5 | 1.61906768 | 114.462 |
| 48 | 166.804899968 | 3.042467082 | L710 | 0.99998200 | 108.876 |
| 49 | 171.848735171 | 59.085369437 | FK5 | 1.50393369 | 109.527 |
| 50 | −933.935513869 | 0.750000000 | L710 | 0.99998200 | 108.228 |
| 51 | 169.262017611 | 29.393250487 | FK5 | 1.50393369 | 99.879 |
| 52 | 493.337795039 | 0.750000000 | L710 | 0.99998200 | 97.471 |
| 53 | 115.491172564 | 40.249706496 | FK5 | 1.50393369 | 84.565 |
| 54 | 983.978746971 | 4.288688991 | L710 | 0.99998200 | 80.296 |
| 55 | 0.000000000 | 44.815189458 | FK5 | 1.50393369 | 79.126 |
| 56 | 0.000000000 | 3.000000000 | L710 | 0.99998200 | 52.977 |
| 57 | 0.000000000 | 40.000000000 | FK5 | 1.50393369 | 49.492 |
| 58 | 0.000000000 | 10.000000000 | L710 | 0.99998200 | 26.153 |
| 59 | 0.000000000 | | | | 14.535 |

ASPHERIC CONSTANTS
SURFACE NO. 2

| | |
|---|---|
| K | 0.0000 |
| C1 | 9.37042284e−009 |
| C2 | −1.34042308e−011 |
| C3 | −2.93763572e−016 |
| C4 | 4.67776977e−020 |
| C5 | −3.20938884e−024 |
| C6 | 6.45491231e−028 |
| C7 | 0.00000000e+000 |
| C8 | 0.00000000e+000 |
| C9 | 0.00000000e+000 |

ASPHERIC CONSTANTS
SURFACE NO. 6

| | |
|---|---|
| K | 0.0000 |
| C1 | 1.89997373e−007 |
| C2 | 5.44778562e−012 |
| C3 | 4.54051764e−016 |
| C4 | 1.82924121e−020 |
| C5 | 1.16522467e−023 |
| C6 | −2.06950311e−027 |

ASPHERIC CONSTANTS
SURFACE NO. 11

| | |
|---|---|
| K | 0.0000 |
| C1 | −6.63292769e−008 |
| C2 | 0.00000000e+000 |
| C3 | 8.79403482e−017 |
| C4 | −2.95855443e−020 |
| C5 | 3.73744864e−024 |
| C6 | −3.39583572e−028 |

ASPHERIC CONSTANTS
SURFACE NO. 21

| | |
|---|---|
| K | 0.0000 |
| C1 | 4.06377005e−008 |
| C2 | −1.49057229e−012 |
| C3 | 7.25253894e−017 |
| C4 | −5.17120726e−021 |
| C5 | 3.05668240e−025 |
| C6 | −8.62404836e−030 |

A first lens group $G_1$ with lenses 1 and 2 has a positive refractive power. A lens group $G_2$ with lenses 3 to 5 has a negative refractive power. A lens group $G_3$ with lenses 6 to 10 has a positive refractive power. A lens group $G_4$ with lenses 11 to 15 has a negative refractive power and a lens group $G_5$ with lenses 16 to 28 has, as a whole, a positive refractive power.

The projection exposure system 101 shown in FIG. 9 is very similar to the one shown in FIG. 8. A main difference to the above-described objective resides in lens 5 which in this case has an aspherical surface. The lens system thus comprises a total of four lenses having an aspherical surface, one of which is included in the first lens group $G_1$, two in the second lens group $G_2$ and a fourth one in the third lens group $G_3$. Again, the aspherical surfaces are each disposed on a surface of a marginal lens of the respective lens group disposed towards an adjacent lens group. For example, now lens 5 belonging to the second lens group $G_2$ has an aspherical surface on its side disposed towards the lens group $G_3$.

FIG. 10 shows a further embodiment of a projection exposure system 101. The optical data thereof are indicated in Table 9 below:

TABLE 9

| Surface | Radii | Thicknesses | Medium | Refractive index | ½ free diameter |
|---|---|---|---|---|---|
| 0 | 0.000000000 | 32.000000000 | L710 | 0.99998200 | 54.410 |
| 1 | 0.000000000 | 9.331875137 | L710 | 0.99998200 | 60.836 |
| 2 | 340.551527021AS | 39.715891248 | FK5 | 1.50393369 | 64.330 |
| 3 | −186.309929743 | 0.750000000 | L710 | 0.99998200 | 64.787 |
| 4 | 141.542483671 | 33.383357176 | FK5 | 1.50393369 | 60.648 |
| 5 | −163.899893068 | 2.610573086 | L710 | 0.99998200 | 58.302 |
| 6 | −123.871118429AS | 7.000000000 | FK5 | 1.50393369 | 58.176 |
| 7 | 95.611801386 | 22.280386062 | L710 | 0.99998200 | 50.403 |
| 8 | −250.168881171 | 7.000000000 | FK5 | 1.50393369 | 50.291 |
| 9 | 133.629519296 | 24.530065417 | L710 | 0.99998200 | 51.234 |
| 10 | −128.592330546 | 7.000000000 | FK5 | 1.50393369 | 52.215 |
| 11 | 435.996432153 | 13.632837749 | L710 | 0.99998200 | 59.973 |
| 12 | −327.496289890 | 13.886025688 | FK5 | 1.50393369 | 62.448 |
| 13 | −155.059472033 | 0.750000000 | L710 | 0.99998200 | 65.245 |
| 14 | −440.826527340 | 15.677208019 | FK5 | 1.50393369 | 70.299 |
| 15 | −179.925282435 | 0.750000000 | L710 | 0.99998200 | 72.668 |
| 16 | 341.908495115 | 33.200091325 | FK5 | 1.50393369 | 82.412 |
| 17 | −255.826237407 | 0.750000000 | L710 | 0.99998200 | 83.699 |
| 18 | 178.301539478 | 33.239991729 | FK5 | 1.50393369 | 85.251 |
| 19 | −1226.293037186 | 0.750000000 | L710 | 0.99998200 | 83.950 |
| 20 | 194.943899883 | 28.359618223 | FK5 | 1.50393369 | 78.544 |
| 21 | −749.005002551AS | 0.750000000 | L710 | 0.99998200 | 75.527 |
| 22 | 271.050782514 | 7.000000000 | FK5 | 1.50393369 | 68.810 |
| 23 | 105.634522505 | 28.202734052 | L710 | 0.99998200 | 60.981 |
| 24 | −306.029742311 | 7.000000000 | FK5 | 1.50393369 | 60.027 |
| 25 | 150.004855021 | 22.462721757 | L710 | 0.99998200 | 56.690 |
| 26 | −187.329555540 | 7.000000000 | FK5 | 1.50393369 | 56.673 |
| 27 | 304.969854455 | 35.116466032 | L710 | 0.99998200 | 58.843 |
| 28 | −81.033917535 | 7.000000000 | FK5 | 1.50393369 | 59.679 |
| 29 | −2073.312944549 | 6.385902439 | L710 | 0.99998200 | 75.490 |
| 30 | −442.663004679 | 32.545158129 | FK5 | 1.50393369 | 76.435 |
| 31 | −134.819767610 | 0.750000000 | L710 | 0.99998200 | 82.632 |
| 32 | −1759.111734795 | 40.360645854 | FK5 | 1.50393369 | 95.217 |
| 33 | −162.361009862 | 0.750000000 | L710 | 0.99998200 | 98.341 |
| 34 | −18055.541517736 | 48.544948355 | FK5 | 1.50393369 | 102.515 |
| 35 | −158.866051572 | 1.645215163 | L710 | 0.99998200 | 103.405 |
| 36 | −156.407134239 | 12.000000000 | LF5 | 1.61906768 | 102.914 |
| 37 | −6393.529232283 | 6.600000000 | L710 | 0.99998200 | 109.938 |
| 38 | 0.000000000 | 1.000000000 | L710 | 0.99998200 | 111.602 |
| 39 | 817.305563716 | 54.187957856 | FK5 | 1.50393369 | 115.189 |
| 40 | −220.943401929 | 2.092015373 | L710 | 0.99998200 | 117.550 |
| 41 | −214.391627564 | 12.000000000 | LF5 | 1.61906768 | 117.539 |
| 42 | −436.013733754 | 0.750000000 | L710 | 0.99998200 | 124.264 |
| 43 | 481.940058078 | 41.665592502 | FK5 | 1.50393369 | 131.389 |
| 44 | −670.182657522 | 0.750000000 | L710 | 0.99998200 | 131.671 |
| 45 | 409.406477442 | 12.000000000 | LF5 | 1.61906768 | 129.565 |
| 46 | 187.024832050 | 1.409033148 | L710 | 0.99998200 | 123.455 |
| 47 | 188.788044323 | 58.072022509 | FK5 | 1.50393369 | 123.830 |
| 48 | 10342.156208557 | 0.750000000 | L710 | 0.99998200 | 122.453 |
| 49 | 261.200133621 | 27.412944131 | FK5 | 1.50393369 | 117.932 |
| 50 | 769.684170935 | 0.750000000 | L710 | 0.99998200 | 115.756 |
| 51 | 189.162055169 | 24.892089316 | FK5 | 1.50393369 | 107.283 |
| 52 | 349.166399485 | 0.750000000 | L710 | 0.99998200 | 104.008 |
| 53 | 162.346317469 | 54.868508820 | FK5 | 1.50393369 | 95.696 |
| 54 | 914.235997056 | 4.515179029 | L710 | 0.99998200 | 79.846 |
| 55 | 0.000000000 | 94.622944676 | FK5 | 1.50393369 | 78.827 |
| 56 | 0.000000000 | 0.800000000 | L710 | 0.99998200 | 28.498 |
| 57 | 0.000000000 | 4.000000000 | FK5 | 1.50393369 | 27.700 |
| 58 | 0.000000000 | 12.000000000 | L710 | 0.99998200 | 25.572 |
| 59 | 0.000000000 | | | | 13.604 |

ASPHERICAL CONSTANTS
SURFACE NO. 2

| K | 0.0000 |
|---|---|
| C1 | 1.27733171e−007 |
| C2 | −5.00437170e−012 |
| C3 | 3.30032423e−016 |
| C4 | 9.45747416e−021 |
| C5 | −8.90830573e−024 |
| C6 | 2.19646028e−027 |

ASPHERICAL CONSTANTS
SURFACE NO. 6

| K | 0.0000 |
|---|---|
| C1 | 1.18195961e−007 |

TABLE 9-continued

| | |
|---|---|
| C2 | 3.80599397e−012 |
| C3 | −2.47232851e−015 |
| C4 | 5.61195650e−019 |
| C5 | −8.66028590e−023 |
| C6 | 6.89083138e−027 |
| ASPHERICAL CONSTANTS SURFACE NO. 21 | |
| K | 0.0000 |
| C1 | 4.49761819e−008 |
| C2 | −1.61311907e−012 |
| C3 | 2.03519674e−016 |
| C4 | −2.44484189e−020 |
| C5 | 2.03153768e−024 |
| C6 | −6.76960872e−029 |

In this embodiment of the projection exposure system, the first, third and fifth lens groups $G_1$, $G_3$ and $G_5$ with lenses 1 and 2, 6 to 10 and 15 to 27 (plus 28), respectively, have, as a whole, a positive refractive power. The lens groups $G_2$ and $G_4$ comprise lenses 3 to 5 and 11 to 14, respectively, and have, as a whole, a negative refractive power.

This embodiment constitutes a particularly advantageous projection exposure system because lenses of a material of the second material group are exclusively included in the fifth lens group $G_5$, that is, in the third bulge. These lenses 18, 20 and 22 are made of the LF5 glass and have each a free diameter which is larger than 80% of the diameter of the largest lens 21. Accordingly, in this embodiment, lenses made of a material of the second material group exhibiting a higher radiation sensitivity are disposed exclusively in regions in which there is both a relative low radiation density due to the large beam bundle diameter and a homogeneous illumination of the entire lens surface due to a small displacement between different beam bundles emanating from different points of the first object plane. Accordingly, this projection exposure system 101 is relatively insensitive to radiation-induced degradation which occurs at high radiation densities.

This advantageous embodiment is enabled, among others, in that, again, one lens with an aspherical surface is disposed in each one of the lens groups $G_1$, $G_2$ and $G_3$ at respective advantageous marginal positions of the lens groups. Moreover, the two lenses 26 and 27 disposed close to the second object 105 are thick lenses with a ratio of thickness to free diameter of 0.311 and 0.657, respectively.

What is claimed is:

1. A projection exposure system positionable between a first object and a second object for imaging the first object in a region of the second object with light of a wavelength band having a width $\delta\lambda$ about a central working wavelength $\lambda$, wherein a relative width $\delta\lambda/\lambda$ of the wavelength band is larger than 0.002, comprising:

at least a first, second, third, fourth and fifth lens group which are successively positioned in this order between the first and the second object along an optical axis and each of which comprises a plurality of lenses, wherein the first, third and fifth lens group each has a positive refractive power and the second and fourth lens group each has a negative refractive power, and wherein the fifth lens group is a lens group which is positioned closest to the second object, wherein each lens is made of a material having an Abbe number $V=(N(x)-1)/N(x-\Delta\delta))-N(x+\delta\lambda)$, wherein $N(x)$ is a refractive index of the material at a wavelength x, and $\Delta\lambda$ is a wavelength difference, and wherein the material is selected from at least two material groups, namely a first material group whose materials have Abbe numbers (V1) which are higher than a limit value (Vg), and a second material group whose materials have Abbe numbers (V2) which are lower than the limit value (Vg), wherein at least one of the lenses is made of a material of the first material group and has a positive refractive power and at least one of the lenses is made of a material of the second material group and has a negative refractive power, wherein the fifth lens group comprises a partial group of at least three directly successively arranged lenses, wherein the partial group comprises a terminal lens which, of all lenses of the system, is the one which is disposed closest to the second object, and wherein a lens directly adjacent to the partial group is made of a material of the second material group, and wherein all lenses of the partial group are made of materials which are included in the first material group.

2. The projection exposure system according to claim 1, wherein the partial group comprises four lenses.

3. The projection exposure system according to claim 1, wherein the partial group comprises five lenses.

4. The projection exposure system according to claim 1, wherein the partial group comprises at least six lenses.

5. The projection exposure system according to claim 1, wherein a lens volume of all lenses made of materials of the second material group is smaller than 20%, preferably, smaller than 15% of a lens volume of all lenses made of materials of the first material group.

6. The projection exposure system according to claim 1, wherein the lens made of the material of the second material group and positioned directly adjacent to the partial group has a free diameter D for which it applies: $D>0.7 * D_{max}$, preferably, $D>0.8 * D_{max}$ and, more preferred, $D>0.9 * D_{max}$, wherein $D_{max}$ is a free diameter of a lens having the largest free diameter of all lenses.

7. The projection exposure system according to claim 1, wherein all lenses of the fifth lens group made of materials of the second material group are positioned along the optical axis in a region wherein a first bundle cross-section of a beam bundle emanating from a first outermost field point of the first object is displaced transversely to the optical axis in respect to a second bundle cross-section of a beam bundle emanating from a second outermost field point of the first object positioned diametrically opposed to the first outermost field point by an amount q, so that it applies: $q/d<0.1$, wherein d is a free diameter of the respective lens.

8. The projection exposure system according to claim 5, wherein all lenses of the fifth lens group which are made of materials of the second material group and disposed between a system diaphragm and the second object are disposed in a region along the optical axis wherein q/d ±0.05.

9. The projection exposure system according to claim 1, wherein at least one lens of the partial group has a maximum thickness along the optical axis and a free diameter such that a ratio of maximum thickness divided by diameter is larger than 0.3.

10. The projection exposure system according to claim 1, wherein the materials of the first material group have a refractive index which is in a range of from $0.93 * \text{NFK5}(\lambda)$ to $1.03 * \text{NFK5}(\lambda)$, wherein $\text{NFK5}(\lambda)$ is a refractive index of a FK5 glass of Schott at the working wavelength.

11. The projection exposure system according to claim 1, wherein the materials of the first material group have a refractive index at a wavelength of 365.5 nm which is smaller than 1.55.

12. The projection exposure system according to claim 1, wherein the materials of the second material group have a refractive index which is in a range of from $0.97 * \text{NLLF1}(\lambda)$ to $1.07 * \text{NLLF1}(\lambda)$, wherein $\text{NLLF1}(\lambda)$ is a refractive index of a LLF1 glass of Schott at the working wavelength.

13. The projection exposure system according to claim 1, wherein the materials of the second material group have a refractive index at a wavelength of 365.5 nm which is higher than 1.54.

14. The projection exposure system according to claim 1, wherein the materials of the second material group have a refractive index which is smaller than $0.99\ \text{NLF5}(\lambda)$, wherein $\text{NLF5}(\lambda)$ is a refractive index of a LF5 glass of Schott at the working wavelength.

15. The projection exposure system according to claim 1, wherein the materials of the second material group have a refractive index at a wavelength of 365.5 nm which is smaller than 1.64.

16. The projection exposure system according to claim 1, wherein the limit value Vg is determined by the equation $$Vg=(VFK5(\lambda)+VLF5(\lambda))/2$$

wherein $VFK5(\lambda)$ is an Abbe number of a FK5 glass of Schott at the working wavelength and $VLF5(\lambda)$ is an Abbe number of a LF5 glass of Schott at the working wavelength.

17. The projection exposure system according to claim 1, wherein the limit value Vg is 400 if the Abbe number is determined at a wavelength $\lambda=365.5$ nm and a wavelength difference $\Delta\lambda=3$ nm.

18. The projection exposure system according to claim 1, wherein the first material group comprises quartz glass.

19. The projection exposure system according to claim 1, wherein a numerical aperture on the side of the second object is higher than 0.6.

20. The projection exposure system according to claim 1, wherein a numerical aperture on the side of the second object is higher than 0.65.

21. The projection exposure system according to claim 19, wherein a Strehl number of the system is higher than 0,95, when determined with a light spectrum of a half-width value of 2 nm on both sides of the working wavelength.

22. The projection exposure system according to claim 1, wherein a minimum distance between opposed surfaces of each pair of directly adjacent lenses is smaller than 25 mm.

23. The projection exposure system according to claim 1, wherein a minimum distance, averaged over all pairs of directly adjacent lenses, between opposed surfaces of the respective pair is smaller than 3 mm.

24. The projection exposure system according to claim 1, wherein the projection exposure system is telecentric on both sides thereof.

25. The projection exposure system according to claim 1, further comprising a diaphragm which is disposed in a region of the fifth lens group.

26. The projection exposure system according to claim 1, wherein the light comprises a light of a mercury-I line.

27. A projection exposure system positionable between a first object and a second object for imaging the first object in a region of the second object with light of a wavelength band having a width $\delta\lambda$ about a central working wavelength $\lambda$, wherein a relative width $\delta\lambda/\lambda$ of the wavelength band is larger than 0.002, comprising:

at least a first, second, third, fourth and fifth lens group which are successively positioned in this order between the first and the second object along an optical axis and each of which comprises a plurality of lenses, wherein the first third and fifth lens group each has a positive refractive power and the second and fourth lens group each has a negative refractive power, and wherein the fifth lens group is a lens group which is positioned closest to the second object, wherein each lens is made of a material having an Abbe number $V=(N(x)-1)/N(x-\Delta\lambda))-N(x+\Delta\lambda)$, wherein $N(x)$ is a refractive index of the material at a wavelength x, and $\Delta\lambda$ is a wavelength difference, and wherein the material is selected from at least two material groups, namely a first material group whose materials have Abbe numbers (V1) which are higher than a lint value (Vg), and a second material group whose materials have Abbe numbers (V2) which are lower than the limit value (Vg), wherein at least one of the lenses is made of a material of the first material group and has a positive refractive power and at least one of the lenses is made of a material of the second material group and has a negative refractive power, wherein lenses of the fourth lens group are made of materials which are included in the second material group and whose refractive index at a wavelength of 365.5 nm is smaller than 1.59.

28. A projection exposure system positionable between a first object and a second object for imaging the first object in a region of the second object with light of a wavelength band having a width $\delta\lambda$ about a central working wavelength $\lambda$, wherein a relative width $\delta\lambda/\lambda$ of the wavelength band is larger than 0.002, comprising:

at least a first, second, third, fourth and fifth lens group which are successively positioned in this order between the first and the second object along an optical axis and each of which comprises a plurality of lenses, wherein the first, third and fifth lens group each has a positive refractive power and the second and fourth lens group each has a negative refractive power, and wherein the fifth lens group is a lens group which is positioned closest to the second object, wherein each lens is made of a material having an Abbe number $V=(N(x)-1)/N(x-\Delta\lambda))-N(x\Delta\lambda)$, wherein $N(x)$ is a refractive index of the material at a wavelength x, and $\Delta\lambda$ is a wavelength difference, and wherein the material is selected from at least two material groups, namely a first material group whose materials have Abbe numbers (V1) which are higher than a limit value (Vg), and a second material group whose materials have Abbe numbers (V2) which are lower than the limit value (Vg), wherein at least one of the lenses is made of a material of the first material group and has a positive refractive power and at least one of the lenses is made of a material of the second material group and has a negative refractive power, wherein all lenses of at least one of the first, second, third and fourth lens group are made of materials which are contained in the first material group, and wherein at least one lens of at least one of the first, second, third and fourth lens group comprises at least one aspherical surface.

29. The projection exposure system according to claim 28, wherein each lens group comprises at most one lens with aspherical surface.

30. The projection exposure system according to claim 28, wherein the at least one lens having the aspherical surface is a lens which, in the direction of the optical axis, is at least one of an outer marginal lens of the lens group, and a lens directly adjacent to the marginal lens.

31. The projection exposure system according to claim 30, wherein the lens having the aspherical surface is the outer marginal lens of the lens group and wherein a surface thereof oriented away from the lens group is the aspherical surface.

32. The projection exposure system according to claim 28, wherein all lenses of the first and the second and the third lens group are made of materials which are included in the first material group.

33. The projection exposure system according to claim 32, wherein furthermore all lenses of the fourth lens group are made of materials which are included in the first material group.

34. The projection exposure system according to claim 28, wherein, of the lenses of the first, second and third lens group, the lenses which are made of materials of the second material group account for a lens volume of less than 10% in regard to a lens volume of all lenses made of materials of the second material group.

35. A projection exposure system positionable between a first object and a second object for imaging the first object in a region of the second object with light of a wavelength band having a width $\delta\lambda$ about a central working wavelength $\lambda$, wherein a relative width $\delta\lambda/\lambda$ of the wavelength band is larger than 0.002, comprising:

at least a first, second, third, fourth and fifth lens group which are successively positioned in this order between the first and the second object along an optical axis and each of which comprises a plurality of lenses, wherein the first, third and fifth lens group each has a positive refractive power and the second and fourth lens group each has a negative refractive power, and wherein the fifth lens group is a lens group which is positioned closest to the second object, wherein each lens is made of a material having an Abbe number $V=(N(x)1)/N(x\Delta\lambda))-N(x\Delta\lambda)$, wherein $N(x)$ is a refractive index of the material at a wavelength x, and $\Delta\lambda$ is a wavelength difference, and wherein the material is selected from at least two material groups, namely a first material group whose materials have Abbe numbers (V1) which are higher than a limit value (Vg), and a second material group whose materials have Abbe numbers (V2) which are lower than the limit value (Vg), wherein at least one of the lenses is made of a material of the first material group and has a positive refractive power and at least one of the lenses is made of a material of the second material group and has a negative refractive power, wherein the lens group disposed closest to the second object comprises at least one pseudo-cemented lens pair, wherein the pseudo-cemented lens pair is formed of a pair of directly adjacent lenses whose lens surfaces which are oriented towards each other are spaced apart from each other at all points in the direction of the optical axis by a distance A which is smaller than 2.5 percent of a free diameter of a larger one of the two lenses, and wherein a first lens of the lens pair is made of a material of the first material group and has a positive refractive power and a second lens of the lens pair is a lens made of a material of the second material group and has a negative refractive power.

36. The projection exposure system according to claim 35, wherein the distance A is smaller than 1.25 percent of the free diameter of the larger one of the two lenses.

37. The projection exposure system according to claim 35, wherein two pseudo-cemented lens pairs are disposed between a diaphragm and the second object.

38. The projection exposure system according to claim 35, wherein the lens surfaces oriented towards each other of the pseudo-cemented lens pair positioned between the diaphragm and the second object are each bulged towards the first object.

39. The projection exposure system according to claim 35, wherein the lens surfaces oriented towards each other of the pseudo-cemented lens pair positioned between a diaphragm and the first object are each bulged towards the second object.

* * * * *

UNITED STATES PATENT AND TRADEMARK OFFICE
CERTIFICATE OF CORRECTION

PATENT NO. : 6,806,942 B2
DATED : October 19, 2004
INVENTOR(S) : Karl-Heinz Schuster et al.

It is certified that error appears in the above-identified patent and that said Letters Patent is hereby corrected as shown below:

Column 19,
Table 5 (cont), "Thicknesses" column, delete "of a material of the Merely the second" and substitute therfor -- of a material of the second --;

Signed and Sealed this

First Day of March, 2005

JON W. DUDAS
*Director of the United States Patent and Trademark Office*

UNITED STATES PATENT AND TRADEMARK OFFICE
CERTIFICATE OF CORRECTION

PATENT NO.    : 6,806,942 B2
DATED         : October 19, 2004
INVENTOR(S)   : Karl-Heinz Schuster et al.

It is certified that error appears in the above-identified patent and that said Letters Patent is hereby corrected as shown below:

Column 8,
Line 63, delete "e respective" and substitute therefor -- to the respective --;

Column 12,
Line 58, delete "20°" and substitute therefor -- 20% --;

Column 15,
Line 13, delete "in of a" and substitute therefor -- in that, of a --;

Column 18,
Line 33, delete "as a a" and substitute therefor -- as a whole, a --;

Column 19,
Line 42, delete "y the LF5" and substitute therefor -- namely the LF5 --;

Column 19, line 48 - Column 20, line 38,
Delete "of a material of the Merely the second" and substitute therfor -- of a material of the second --;

Column 20,
Lines 44-45, delete "closest wafer" and substitute therefor -- closest to the wafer --;

Column 35,
Line 3, delete "q/d ±0.05" and substitute therefor -- q/d < 0.05 --; and Column 36,
Line 26, delete "lint value" and substitute therefor -- limit value --.

Signed and Sealed this

Twenty-fourth Day of May, 2005

JON W. DUDAS
*Director of the United States Patent and Trademark Office*